US012635226B2

(12) United States Patent
Yedinak

(10) Patent No.: US 12,635,226 B2
(45) Date of Patent: May 19, 2026

(54) SEMICONDUCTOR DEVICE WITH TRENCH-IMPLEMENTED POLY DIODES

(71) Applicant: SEMICONDUCTOR COMPONENTS INDUSTRIES, LLC, Phoenix, AZ (US)

(72) Inventor: Joseph Andrew Yedinak, Mountain Top, PA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 454 days.

(21) Appl. No.: 17/538,552

(22) Filed: Nov. 30, 2021

(65) Prior Publication Data
US 2022/0181480 A1     Jun. 9, 2022

Related U.S. Application Data

(60) Provisional application No. 63/199,130, filed on Dec. 8, 2020.

(51) Int. Cl.
| | |
|---|---|
| *H10D 84/00* | (2025.01) |
| *H10D 30/01* | (2025.01) |
| *H10D 62/10* | (2025.01) |
| *H10D 30/66* | (2025.01) |
| *H10D 64/23* | (2025.01) |

(52) U.S. Cl.
CPC ....... H10D 84/141 (2025.01); H10D 30/0297 (2025.01); H10D 62/115 (2025.01);
(Continued)

(58) Field of Classification Search
CPC ............. H01L 29/7803; H01L 29/0649; H01L 29/66734; H01L 29/7804; H01L 29/41741; H01L 29/7811; H01L 29/7813; H01L 27/0629; H01L 28/20; H01L 29/04; H01L 29/16; H01L 29/0696; H01L 29/1095;
(Continued)

(56) References Cited

U.S. PATENT DOCUMENTS

| | | | |
|---|---|---|---|
| 7,061,066 B2 * | 6/2006 | Kocon | ..................... H10D 8/20 |
| | | | 257/E29.256 |
| 7,544,545 B2 | 6/2009 | Chen et al. | |

(Continued)

*Primary Examiner* — Mohammad M Hoque

(74) *Attorney, Agent, or Firm* — Brake Hughes Bellermann LLP

(57)     ABSTRACT

In a general aspect, a semiconductor device can include a semiconductor substrate, a trench formed in the semiconductor substrate and a first dielectric layer lining the trench. The semiconductor device can further include a first semiconductor material disposed in a lower portion of the trench. The first dielectric layer being can be disposed between the semiconductor substrate and the first semiconductor material. The semiconductor device can also include a second dielectric layer disposed on the first semiconductor material and a second semiconductor material disposed in an upper portion of the trench. The first dielectric layer can be disposed between the semiconductor substrate and the second semiconductor material. The second dielectric layer can be disposed between the first semiconductor material and the second semiconductor material. The semiconductor device can also include at least one of a diode or a resistor defined in the second semiconductor material.

17 Claims, 16 Drawing Sheets

(52) U.S. Cl.
CPC ......... *H10D 84/143* (2025.01); *H10D 30/665* (2025.01); *H10D 30/668* (2025.01); *H10D 64/252* (2025.01)

(58) Field of Classification Search
CPC ............. H01L 29/407; H01L 29/41766; H01L 29/7805; H01L 29/861; H01L 29/7827; H01L 27/0255; H01L 27/0288; H01L 29/66666; H01L 29/66795; H01L 29/785
USPC ........................................................ 257/66
See application file for complete search history.

(56) References Cited

U.S. PATENT DOCUMENTS 8,564,047  B2     10/2013  Hsieh

| | | | | |
|---|---|---|---|---|
| 8,816,348 | B2 * | 8/2014 | Hsieh | H10D 8/605 257/334 |
| 9,373,692 | B2 | 6/2016 | Hirleer et al. | |
| 9,431,550 | B2 | 8/2016 | Chen et al. | |
| 2004/0256690 | A1 * | 12/2004 | Kocon | H10D 64/112 257/E29.256 |
| 2006/0281249 | A1 | 12/2006 | Yilmaz et al. | |
| 2007/0085136 | A1 * | 4/2007 | Krumrey | H10D 84/148 257/330 |
| 2007/0138544 | A1 * | 6/2007 | Hirler | H01L 27/04 257/E29.183 |
| 2007/0290257 | A1 | 12/2007 | Kraft et al. | |
| 2010/0140695 | A1 * | 6/2010 | Yedinak | H01L 29/7811 257/334 |
| 2010/0258853 | A1 * | 10/2010 | Lin | H10D 30/0297 438/270 |
| 2013/0075809 | A1 | 3/2013 | Hsieh | |
| 2019/0198660 | A1 * | 6/2019 | Kachi | H10D 62/106 |

* cited by examiner

100

150

600

Form dielectric lined trench
602

Form shield electrode in lower portion of trench
604

Form interlayer dielectric on shield electrode
606

Form poly electrode in upper portion of trench
608

Form back-to-back diodes, single sided diode(s)
and/or resistors with poly electrode
610

Ground shield electrode
612

Form grounded region(s) adjacent to trench
sidewalls
614

SEMICONDUCTOR DEVICE WITH TRENCH-IMPLEMENTED POLY DIODES

RELATED APPLICATIONS

This application claims priority to and the benefit of U.S. Provisional Application No. 63/199,130, filed on Dec. 8, 2021, and entitled "TRENCH POLY DIODE AND RESISTOR LAYOUTS FOR SHIELDED GATE MOSFETS," which is incorporated by reference herein in its entirety.

TECHNICAL FIELD

This disclosure is directed to shielded diode and resistor implementations that are implemented in a trench that is formed in a semiconductor substrate (semiconductor layer), such as in combination with a transistor (e.g., a shielded-gate metal-oxide-semiconductor field-effect transistor (MOSFET)).

BACKGROUND

Power transistors, such as metal-oxide-semiconductor field-effect transistors (MOSFETs) can operate across a range of voltages and are used in a broad rang e of applications, such as in power converter circuits, power-over-Ethernet bridges, etc. Such transistors can be implemented in a semiconductor die, which can include integrated passive devices, such as a diodes and/or resistors (e.g., for electrostatic discharge protection, current control, etc.). In current implementations, formation of such integrated passive devices can require dedicated processing operations, which can increase manufacturing time and cost.

SUMMARY

In a general aspect, a semiconductor device can include a semiconductor substrate, a trench formed in the semiconductor substrate and a first dielectric layer lining the trench. The semiconductor device can further include a first semiconductor material disposed in a lower portion of the trench. The first dielectric layer being can be disposed between the semiconductor substrate and the first semiconductor material. The semiconductor device can also include a second dielectric layer disposed on the first semiconductor material and a second semiconductor material disposed in an upper portion of the trench. The first dielectric layer can be disposed between the semiconductor substrate and the second semiconductor material. The second dielectric layer can be disposed between the first semiconductor material and the second semiconductor material. The semiconductor device can also include at least one of a diode or a resistor defined in the second semiconductor material.

In another general aspect, a semiconductor device can include a semiconductor substrate, a first trench formed in the semiconductor substrate, a second trench formed in the semiconductor substrate, and a first dielectric layer lining the first trench and the second trench. The first semiconductor material can be disposed in a lower portion of the first trench and a lower portion of the second trench. The first dielectric layer can be disposed between the semiconductor substrate and the first semiconductor material in the first trench and in the second trench. The semiconductor device can also include a second dielectric layer disposed on the first semiconductor material in the first trench and in the second trench. The semiconductor device can further include a second semiconductor material disposed in an upper portion of the first trench and in an upper portion of the second trench. The first dielectric layer being can be disposed between the semiconductor substrate and the second semiconductor material in the first trench and in the second trench. The second dielectric layer can be disposed between the first semiconductor material and the second semiconductor material in the first trench and in the second trench. The semiconductor device can further include, for each of the first trench and the second trench, at least one of a diode or a resistor defined in the second semiconductor material.

In another general aspect, a method can include forming a trench in a semiconductor substrate, forming a shield dielectric layer lining the trench, and forming a shield electrode in a lower portion of the trench. The shield dielectric layer can be disposed between the shield electrode and the semiconductor substrate. The method can further include forming an interlayer dielectric layer on the shield electrode, forming a poly silicon electrode in an upper portion of the trench. The shield dielectric layer can be disposed between the polysilicon electrode and the semiconductor substrate. The interlayer dielectric can be disposed between the shield electrode and the polysilicon electrode. The method can also include doping the polysilicon electrode to define at least one of a diode or a resistor.

Figures 1A, 1B:
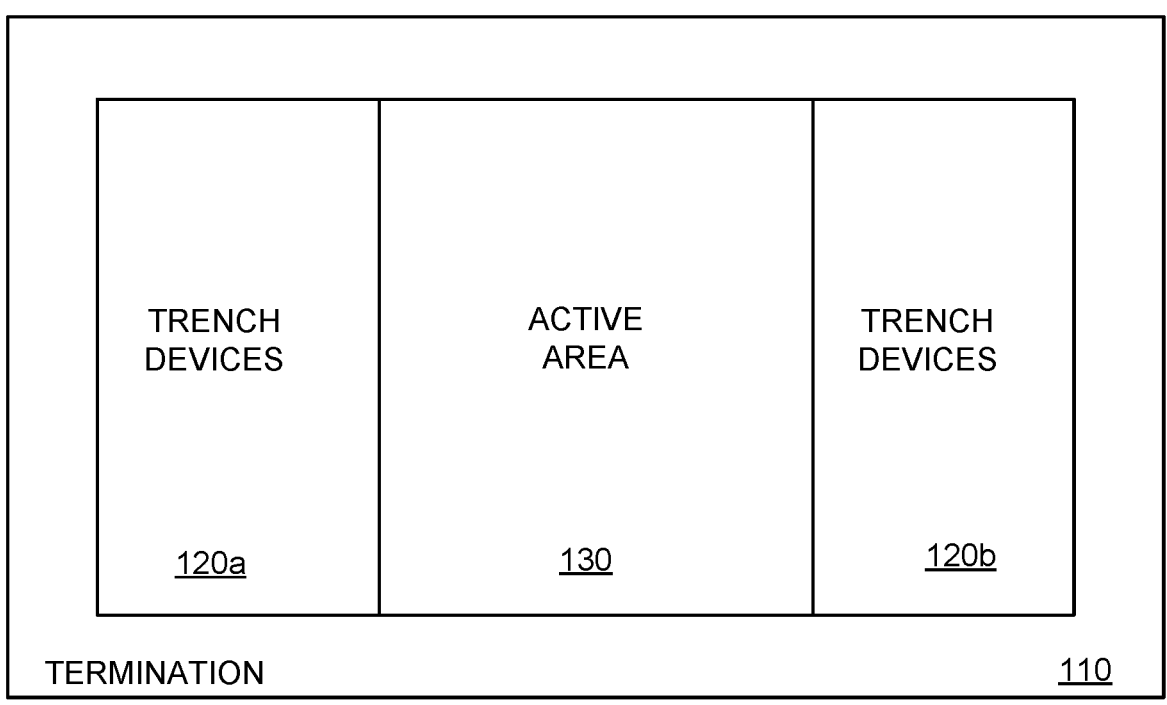
FIGS. 1A and 1B are block diagrams schematically illustrating views of example semiconductor devices.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

The present disclosure is directed to approaches for implementing diodes and/or resistors in a trench, or multiple trenches, where the trenches are disposed (formed, etched, etc.) in a semiconductor substrate of a semiconductor device. In some implementation, the diodes and/or resistors can be implemented in a semiconductor device that includes a transistor device, such as a shielded trench-gate metal-oxide semiconductor field-effect transistor (shielded trench-gate MOSFET). In the implementations described herein can be implemented using semiconductor layers (e.g., poly-silicon layers) that are also used to respectively implement shield electrodes and gate electrodes of a corresponding MOSFET devices. That is, in the approaches described herein, diodes and/or resistors can be implemented without utilizing a surface polysilicon layer. Accordingly, in some implementations, processing operations associated with producing surface polysilicon can be omitted or eliminated, thus reducing processing complexity and or cost. Further, the approaches described herein allow for planarization of semiconductor layers used to form such diodes and/or resistors, which can achieve improved process control, (e.g., reduce process variation, allow for more accurate critical dimension control and, accordingly, allow for producing smaller device geometries).

In example implementations, trench-implemented diodes and/or resistors can be shielded, e.g., from a drain potential of a MOSFET included in a common semiconductor substrate. That is, a grounded shield electrode that is electrically isolated from the diodes and/or resistors can be used to shield the trench-implemented devices from a drain potential of the MOSFET that is present on a backside of a corresponding semiconductor substrate. This shielding can prevent the drain potential from causing surface inversion (e.g., parasitic MOSFET behavior) that can adversely affect operation of the diodes and/or resistors, such as reducing blocking voltage and/or increasing leakage current. Further in the approaches described herein, additional shielding can be achieved using a well region that is electrically coupled with a source potential of an associated MOSFET. For example, the well region can be a p-well region (for an n-channel MOSFET implementation), of an n-well region (for a p-channel MOSFET region). In some implementations, the well region can be a common well region with a body region for an associated MOSFET.

For purposes of this disclosure, examples of trench-implemented shielded diodes and resistors, which can be collectively referred to as trench-implemented devices or trench devices, are described in connection with a shielded trench-gate MOSFET. That is, the trench-implemented devices and a shielded trench-gate MOSFET are described as being implemented, by way of example and of purposes of illustration, in a common semiconductor substrate. In some implementations, other transistor devices can be combined with such trench-implemented devices, such as non-shielded trench-gate MOSFETs, or other types of transistors.

Diodes and/or resistors implemented in accordance with the approaches described herein can be used for electrostatic discharge (ESD) protection, voltage clamping, current flow, etc. For instance, such diodes and/or resistors can be used for ESD protection of MOSFETs with thin gate dielectrics, used in power-over-Ethernet bridges, and so forth. Also, while specific materials are referenced herein, in implementations, other appropriate materials can be used. For instance, poly-silicon electrodes can be implemented using other materials, such as other semiconductor materials. Such diodes and/or resistors can be configured such that can be connected (electrically coupled) to external control circuits. For instance, diodes for sensing device temperature can be connected to an external temperature sensing circuit.

FIGS. 1A and 1B are block diagrams schematically illustrating views of example semiconductor devices, respectively a semiconductor device 100 and a semiconductor device 150. Specifically, FIGS. 1A and 1B illustrate example arrangements (e.g., plan views) of semiconductor devices that can include implementations of trench-implemented devices (diodes and/or resistors) such as those described herein. The examples of FIGS. 1A and 1B are given by way of example, and implementations can include elements, regions and/or areas other than those shown. For instance, implementations can include metallization layers that are used to implement signal pads and/or signal busses for signal communication, such as gad pad metal, gate bus metal, source pad metal, source bus metal, signal pads for external connection to the trench-implemented devices (diodes and/or resistors). etc., which can be used for communication of electrical signals during operation of a transistor, and/or other circuit elements included in the semiconductor devices 100 and/or 150.

Referring to FIG. 1A, the semiconductor device 100 includes a termination region 110 that is disposed around a perimeter of device 100. In implementations, the termination region 110 can include floating and/or grounded electrodes disposed in dielectric lined trenches, guard ring implants, and/or dielectric filled trenches, as some examples. In the example of FIG. 1A, the device 100 also includes a trench device region (region) 120a, a trench device region 120b, and an active area 130, where the active area 130 is disposed between the trench device region 120a and the trench device region 120b. In an implementation, a MOSFET can be implemented in the active area 130, while trench-implemented diodes and/or resistors, such as those described herein, can be implemented in regions 120a and 120b. In some implementations, the device 100 can include only one of the regions 120a or 120b, with a larger active area 130, or a smaller overall area (e.g., a smaller semiconductor substrate area) of the device 100. In some implementations, the device 100 can include additional trench device regions, or can include trench device regions of different shapes or size, such as a trench device region that is concentric with the termination region 110 and disposed around a perimeter of the active area 130. In some implementations, the device 100 can include trench device regions only in a portion of one of regions 120a or 120b, or in respective portions of both regions 120a and 120b.

Referring to FIG. 1B, the semiconductor device 150 includes a termination region 160 that is disposed around a perimeter of device 150. In implementations, as with the device 100, the termination region 160 can include floating and/or grounded electrodes disposed in dielectric lined trenches, guard ring implants, and/or dielectric filled trenches, as some examples. In the example of FIG. 1B, the device 150 also includes a trench device region 170a, a trench device region 170b, a trench device region 170c, a trench device region 170d, and an active area 180, where the trench device regions 170a-170d are disposed around a perimeter of the active area 180, and adjacent (e.g., directly adjacent) to the termination region.

As with the device 100, in an implementation, a MOSFET can be implemented in the active area 180, while trench-implemented diodes and/or resistors, such as those described herein, can be implemented in trench device regions 170a-170d. Similar to the device 100, in some implementations, the device 150 can include fewer or more trench device regions, or can include trench device regions of different shapes or size.

While specific arrangements of different device elements and regions shown and described herein, in some implementations, these elements and regions can have other arrangements. For instance, trench-implemented devices can be implement in other locations within a semiconductor die (e.g., in a central portion of the semiconductor die, rather than along the edges of the die). For instance pad metal (e.g., gate pad metal, source pad metal, etc.) can be implemented with an active area, within a termination region and/or within a trench device region. Such pad metal can also be implemented to allow external connection to trench-implemented devices, such as diodes (e.g., single-sided diodes) for temperature sensing. In some implementation, bus metal can be used to connect pad metal along a semiconductor die's edges to trench-implemented devices formed in an interior of the semiconductor die.

FIGS. 2, 3, 4 and 5 are diagrams that illustrate, respectively, layout views of semiconductor devices 200, 300, 400 and 500. For purposes of illustration, in each of FIGS. 2, 3, 4 and 5, a portion of the corresponding semiconductor device is illustrated. The semiconductor devices 200 and 300 can have an arrangement corresponding with the arrangement of the semiconductor device 100 of FIG. 1A, while the semiconductor devices 400 and 500 can have an arrangement corresponding with the arrangement of the semiconductor device 150 of FIG. 1B.

Figure 2:
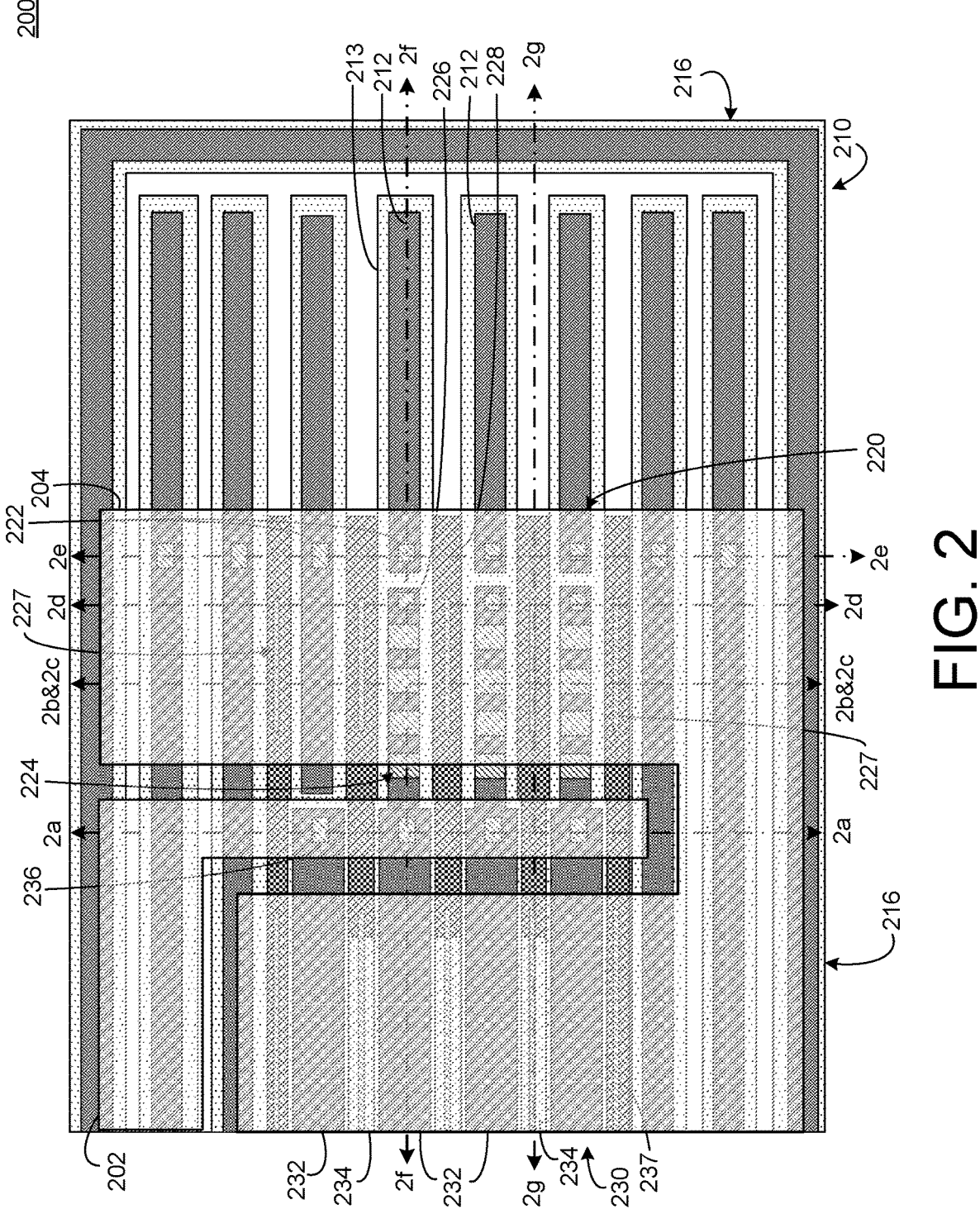
FIG. 2 is a diagram illustrating a top view of a semiconductor device that can be arranged in accordance with FIG. 1A.

FIGS. 2A-2G illustrate cross-sectional views of the semiconductor device 200 along corresponding cut lines shown in FIG. 2, which show examples of underlying structure of the semiconductor device 200. FIGS. 3A-3D illustrate cross-sectional views of the semiconductor device 300 along corresponding section lines shown in FIG. 3, which show examples of underlying structure of the semiconductor device 300. FIGS. 4A-4B illustrate cross-sectional views of the semiconductor device 400 along corresponding section lines shown in FIG. 4, which show examples of underlying structure of the semiconductor device 400. FIGS. 5A-5E illustrate cross-sectional views of the semiconductor device 500 along corresponding section lines shown in FIG. 5, which show examples of underlying structure of the semiconductor device 500. As the layout views of FIGS. 2, 3, 4 and 5 are best understood in view their respective underlying structure, each of these layout views is described with further reference to its corresponding cross-sectional views.

The example devices 200, 300, 400 and 500 can include similar features, elements and/or structures, such as drain contact metal, epitaxial layers included in, or with, a heavily doped semiconductor substrate layer, implant regions, and so forth. For purposes of the brevity and clarity, such similar features may not be described with respect to each of the devices, or each of the separate views of a device. Further, in the various views of the devices 200, 300, 400 and 500, some illustrated elements are shown by way of reference and may not be explicitly referenced or described. Still further, some elements that can be included in the devices 200, 300, 400 and 500 may be not explicitly shown in the illustrated views. Such elements include MOSFET source implant regions, and heavy body implants, as two examples.

Referring to FIG. 2, and its corresponding cross-sectional views in FIGS. 2A-2G, the device 200 can include a termination region 210 that is disposed around a perimeter of the device 200. The device 200 can also include a trench device region 220 and an active area 230 (e.g., as in the arrangement of the device 100 in FIG. 1A). In this example, a plurality of strings of back-to-back diodes 224 are implemented in the trench device region 220 and a shielded trench-gate MOSFET (an n-channel MOSFET in this example) is implemented in the active area 230, where the back-to-back diodes are electrically coupled between a gate terminal and a source terminal (ground) of the MOSFET implemented in the active area 230.

As shown in FIG. 2, the device 200 includes gate metallization 202 (e.g., a gate bus) that can be used to provide a gate signal to the MOSFET, and source metallization 204 (e.g., a source bus) that can be used to provide a source potential (electrical ground) to the MOSFET, as well as other elements of the device 200. As further shown in FIG. 2, the device 200 includes trenches 232 and semiconductor mesas 234 that extend from the termination region 210, through the trench device region 220, and into the active area 230.

Figure 2A:
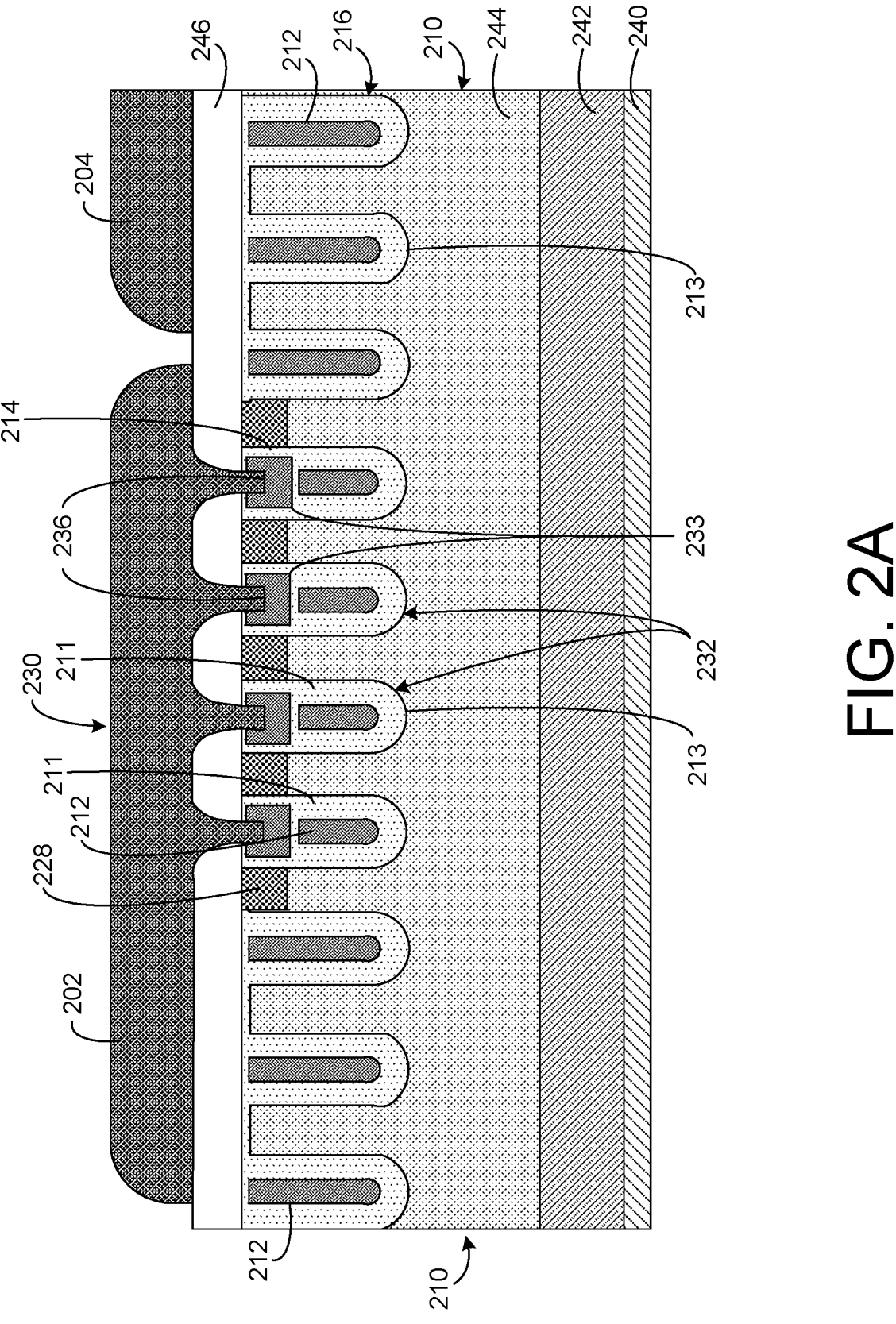
FIGS. 2A-2G are diagrams illustrating cross-sectional views of the semiconductor device of FIG. 2.

FIG. 2A illustrates a cross-sectional view of the device 200 along the section line 2a-2a in FIG. 2. As can be seen from FIGS. 2 and 2A, the section line 2a-2a extends through the gate metallization 202 in the termination region 210 (along the top of the device 200 in the view of FIG. 2) and the active area 230. As shown in the cross-sectional view of FIG. 2A, the gate metallization 202 is electrically coupled with polysilicon electrodes (poly electrodes) 233 disposed in upper portions of the trenches via contacts 236 (also indicated in FIG. 2). As used herein, contact or contacts can refer to electrical contacts formed using metallization in a semiconductor process.

In the active area 230, the poly electrodes 233 implement gate electrodes of the MOSFET. As further shown in FIG. 2A, in the active area 230, shield polysilicon (shield poly) 212 is recessed in the trenches 232 and interlayer dielectric 211 is disposed between the shield poly 212 and the poly electrodes 233. Also in the trenches 232, as shown in FIG. 2A, in the active area 230, a shield dielectric 213 is included in a lower portion of the trenches, while a (thinner) gate dielectric 214 is included in an upper portion of the trenches 232.

In the termination region 210, as shown in FIG. 2A, un-recessed shield poly 212 is disposed in termination trenches lined with shield dielectric 213. For reference purposes, an outer termination trench 216 is indicated in both FIGS. 2 and 2A. FIGS. 2 and 2A (as well FIGS. 2B-2E and 2G) also illustrate well regions 228 (e.g., p-type well regions for an n-channel MOSFET), which are disposed adjacent to the trenches 232 (e.g., at a surface of a semiconductor substrate of the device 200). The well-regions 228 can include a body region the MOSFET, and also can provide sidewall shielding to trench-implemented devices in the trench device region 220. The depth of the well-regions 228 can depend on the particular implementation, such as on an operating voltage of a MOSFET implemented in the active area 230.

In this example, the device 200 includes a drain contact metal 240 disposed on a bottom surface of a semiconductor substrate, where the semiconductor substrate includes a highly doped region 242 and a more lightly doped epitaxial region 244. In some implementations, the epitaxial region 244 can include one or more epitaxial layers having different doping concentrations, for instance a doping concentration of the epitaxial region 244 can be graded (e.g., decreasing with a distance from the highly doped region 242). The device 200 further includes a dielectric material 246 that isolates the gate metallization 202 and the source metallization 204 from underlying elements of the device 200, except where electrical connections are defined using metal contacts extending through the dielectric material 246.

Figure 2B:
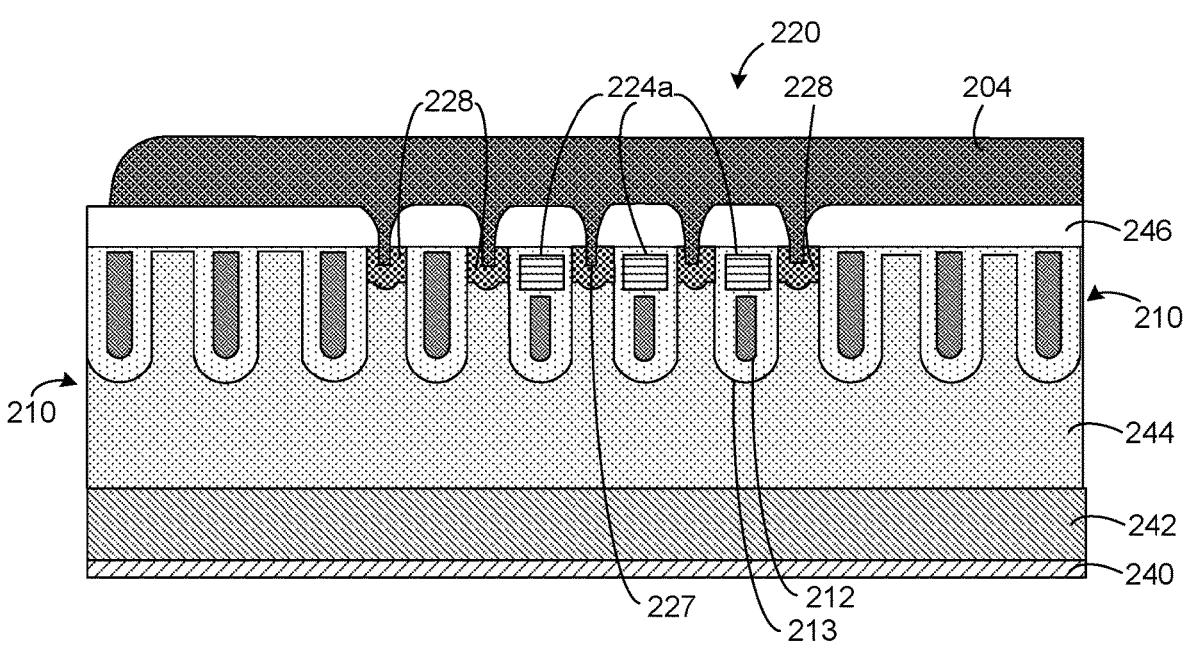
Figure 2C:
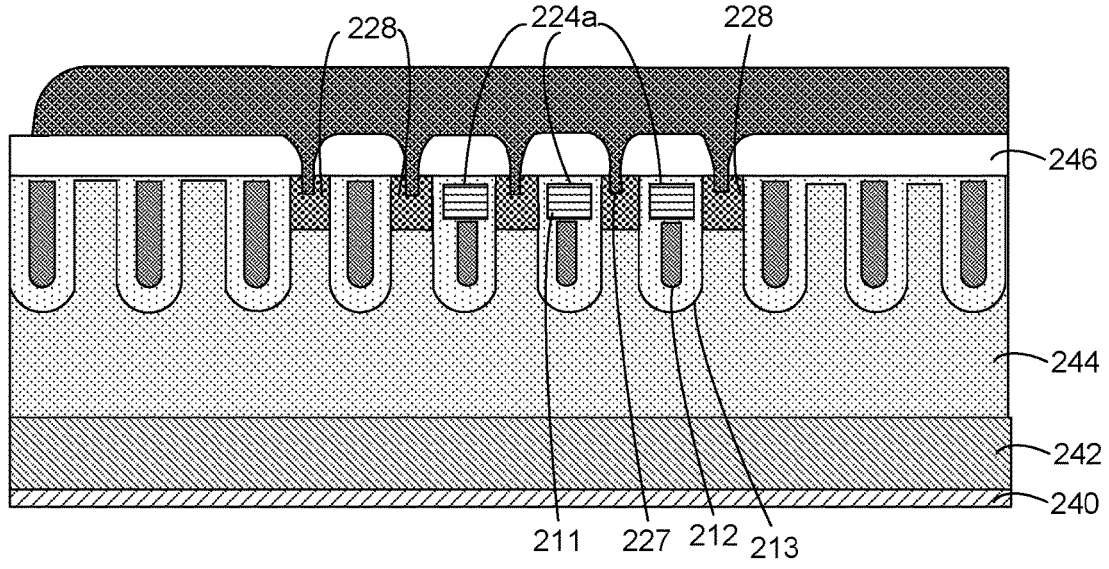

FIGS. 2B and 2C illustrate two example cross-sectional views of the device 200 along the section line indicated as 2b & 2c-2b & 2c in FIG. 2. As can be seen from FIGS. 2, 2B and 2C, the section line 2b & 2c-2b & 2c extends through the source metallization 204 in the termination region 210 and the trench device region 220. The section line 2b & 2c-2b & 2c also extends through contacts 227 from the source metallization 204 to the well regions 228, and through respective anode regions 224a of strings of back-to-back trench-implemented diodes 224. Comparing FIG. 2C with FIG. 2B, the well-regions 228 in FIG. 2C are formed such that they are deeper than the well regions 228 in FIG. 2B. As discussed herein, such deeper well regions 228 can provide additional shielding for trench-implemented devices, such for as shielding the back-to-back diodes 224 from the MOSFET's drain potential from a backside drain contact (e.g., the drain contact metal 240).

Figure 2D:
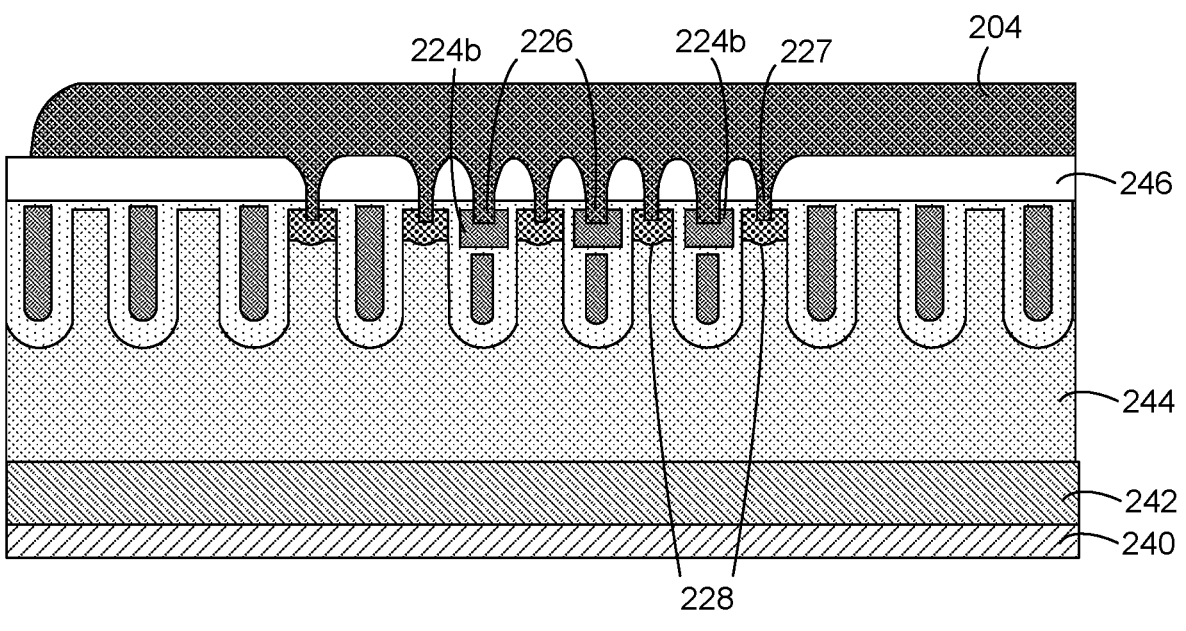

FIG. 2D illustrates a cross-sectional view of the device 200 along the section line 2d-2d in FIG. 2. As can be seen from FIGS. 2 and 2D, the section line 2d-2d extends through the source metallization 204 in the termination region 210 and the trench device region 220. The section line 2d-2d also extends through contacts 227 from the source metallization 204 to the well regions 228, through respective cathode regions 224b of the strings of back-to-back trench-implemented diodes 224, and through respective contacts 226 to the illustrated cathodes 224b (e.g., respective cathodes 224b of each of the last diodes of the three strings back-to-back diodes 224, as is further illustrated in FIG. 2F).

Figure 2E:
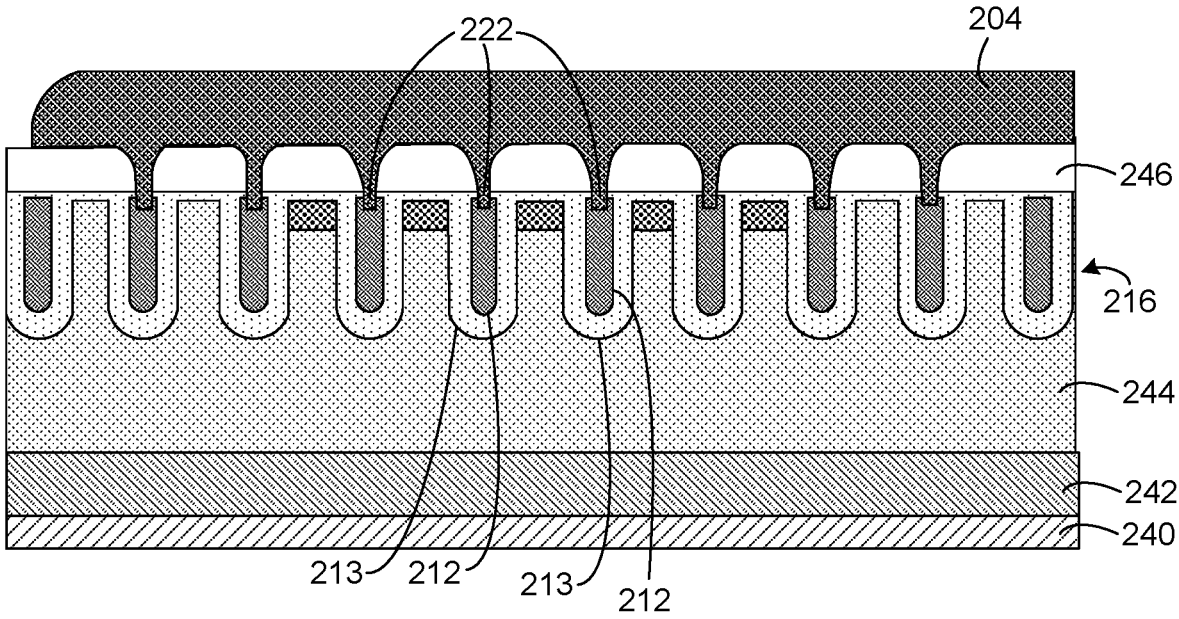
Figure 4:
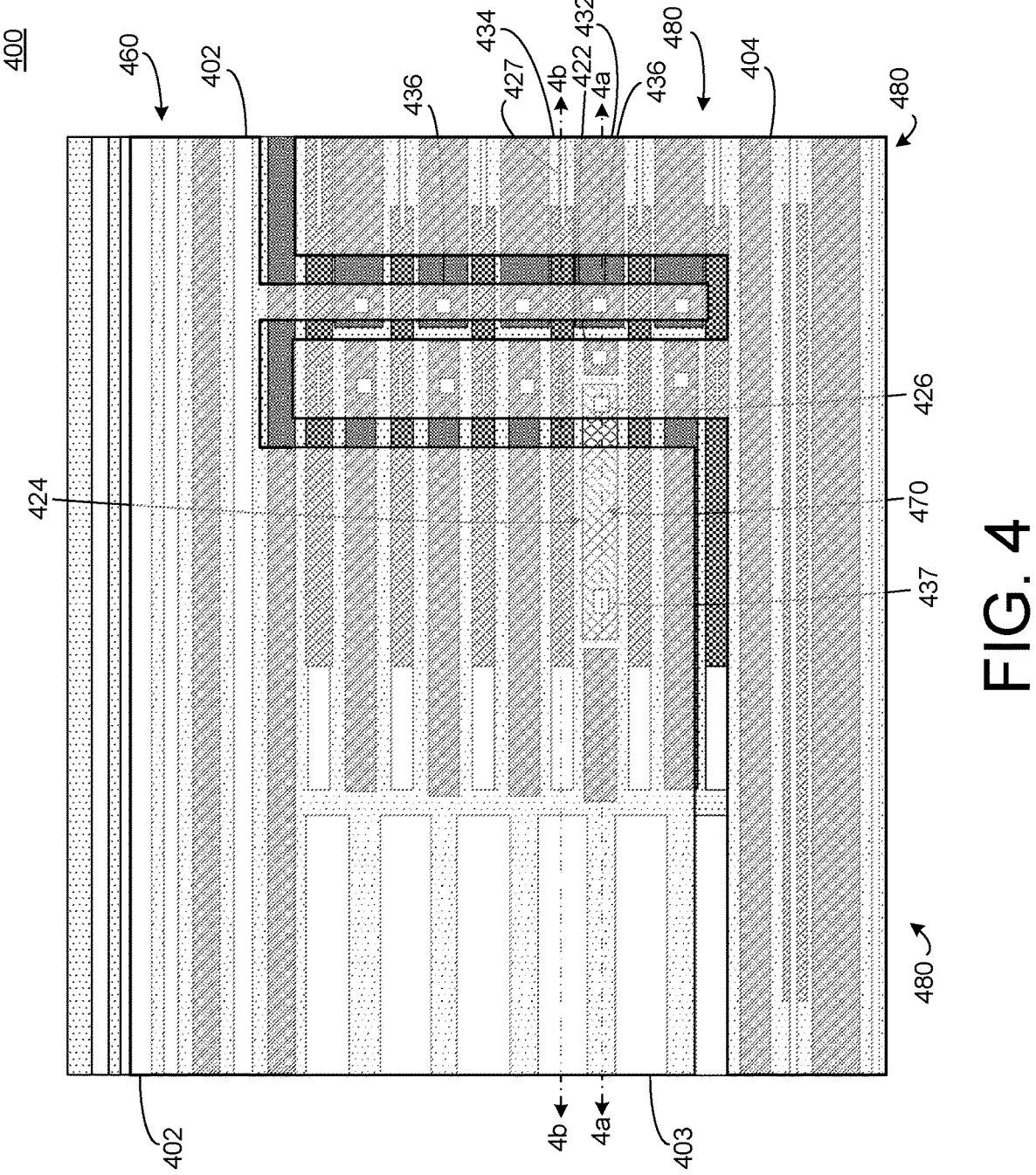
FIG. 4 is a diagram illustrating a top view of a semiconductor device that can be arranged in accordance with FIG. 1B.

FIG. 2E illustrates a cross-sectional view of the device 200 along the section line 2e-2e in FIG. 2. As can be seen from FIGS. 2 and 2E, the section line 2e-2e extends through the source metallization 204 in the termination region 210 and the trench device region 220. The section line 2e-2e also extends through contacts 222 from the source metallization 204 to the shield poly 212. As also shown in FIGS. 2 and 2E, in this example, the shield poly 212 in the outer termination trench 216 is not contacted by source metallization (e.g., is electrically floating) in this example. In some implementations, shield poly (e.g., shield poly 212) disposed in an outer termination trench (e.g., trench 216) can be electrically couple to source metallization 204 in another portions of the device 200, such as ends of trenches 232. Such shield poly can be physically (and electrically) continuous. In some implementations, the trench 216 can be omitted, and/or ends of the trench 232 ends can connected to on another using an oxide filled trench, such as shown in FIG. 4, along section lines 4a-4a & 4b-4b.

Figures 2F, 2G:
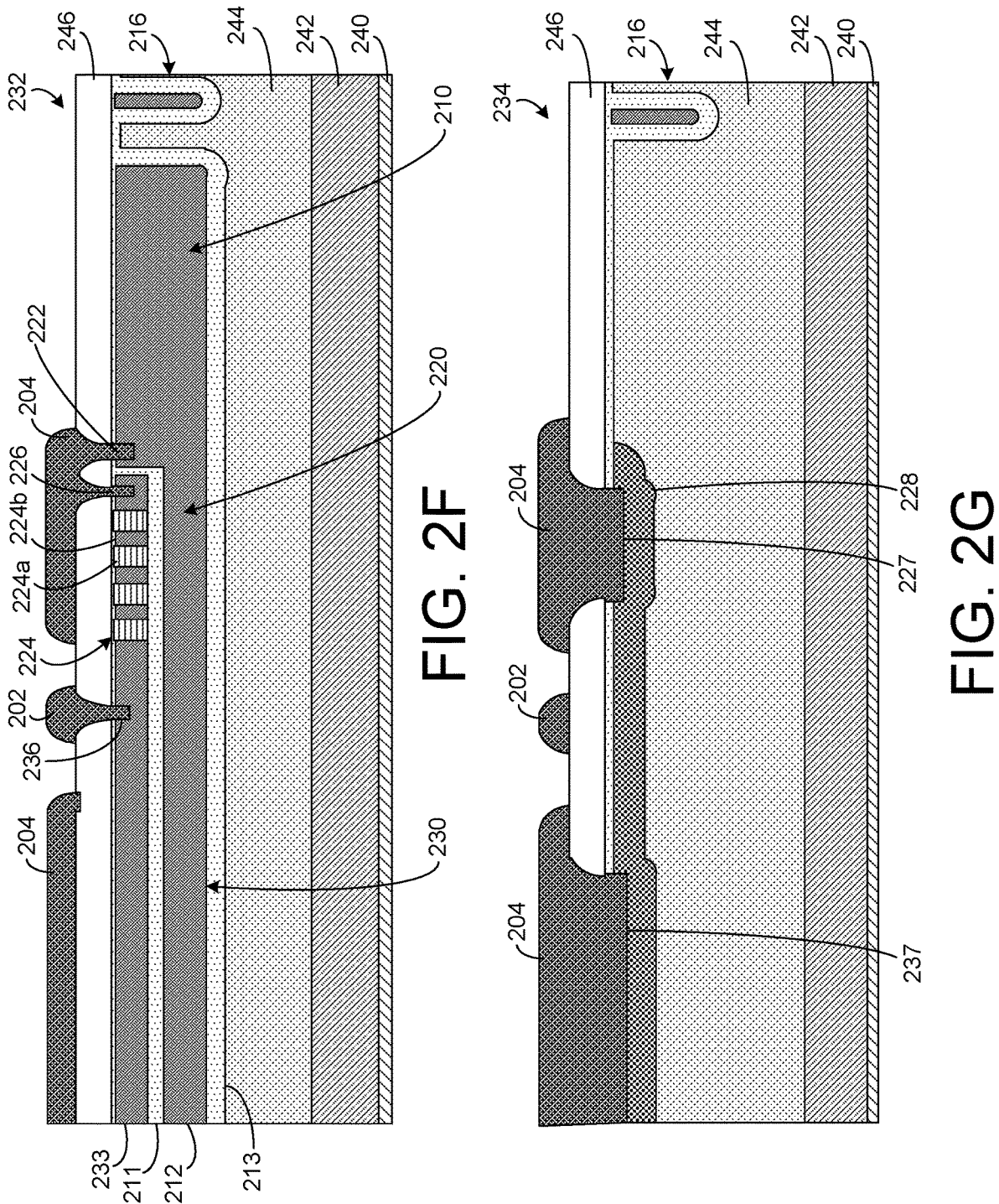

FIG. 2F illustrates a cross-sectional view of the device 200 along the section line 2f-2f in FIG. 2. As can be seen from FIGS. 2 and 2F, the section line 2f-2f extends through one of the trenches 232 from the termination region 210, through the trench device region 220 and into the active area 230. As shown in FIG. 2F, in the trench 232, the shield poly 212 extends under the poly electrode 233, where the poly electrode 233 implements both a gate electrode of the MOSFET of the device 200 and the string of back-to-back diodes 224. The shield poly 212 is thus disposed between the poly electrode 233 and the drain metal contact, e.g., to implement a grounded field plate to shield the string of back-to-back diodes 224 from the drain potential during operation of the MOSFET.

As can be seen in FIG. 2F, adjacent diodes of the string of back-to-back diodes 224 share either a cathode 224b or an anode 224a. The right most cathode 224b (in the view of FIG. 2F) is electrically coupled to the source metallization 204 via the contact 226 and the shield poly 212 is electrically coupled to the source metallization via the contact 222, which is proximate to the string of back-to-back diodes 224 (e.g., adjacent to the vertical portion of the interlayer dielectric 211). In some implementations, the contacts 222 can spaced (e.g., laterally spaced) less than 10 micrometers from the back-to-back diodes 224 (or other trench-implemented devices, such as in the examples described herein). Such an arrangement (along with shield poly below trench-implemented devices) can reduce and/or prevent build-up of MOSFET drain potential in the body region directly adjacent to the trench-implemented devices, could cause the trench sidewalls of the p-type regions of trench-implemented diodes to invert (e.g., change conductivity type). As noted above, this potential can occur via the applied MOSFET drain potential, particularly during electrical transients or due to lateral current flow in the body region from avalanche current that would flow laterally through the body region to the active area.

As also shown in FIGS. 2 and 2F, a gate electrode portion of the poly electrode 233 (e.g., a first portion of the poly electrode 233) is coupled with the gate metallization 202 via the contact 236 in the active area 230, while a second portion of the poly electrode 233 includes the back-to-back diodes 224 in the trench device region 220. In other implementations different poly electrodes can be used to respectively implement the different portions of the poly electrode 233. That is, a first poly electrode can be used for the first (gate electrode) portion, and a second poly electrode can be used for the second portion including the back-to-back diodes 224 (or other trench-implemented devices). The different poly electrodes can be formed from a same semiconductor material, or from different semiconductor materials.

FIG. 2G illustrates a cross-sectional view of the device 200 along the section line 2g-2g in FIG. 2. As can be seen from FIGS. 2 and 2G, the section line 2g-2g extends through one of the mesas 234 from the termination region 210, through the trench device region 220 and into the active area 230. As shown in FIGS. 2 and 2G, the source metallization 204 is electrically coupled with the well region 228 via a contact 237 in the active area 330 and via the contact 227 in the trench device region 220. In this cross-sectional view, the gate metallization 202 over the mesa 234 in the active area 230 is disposed on the dielectric material 246 without contact to any underlying elements.

Figure 3:
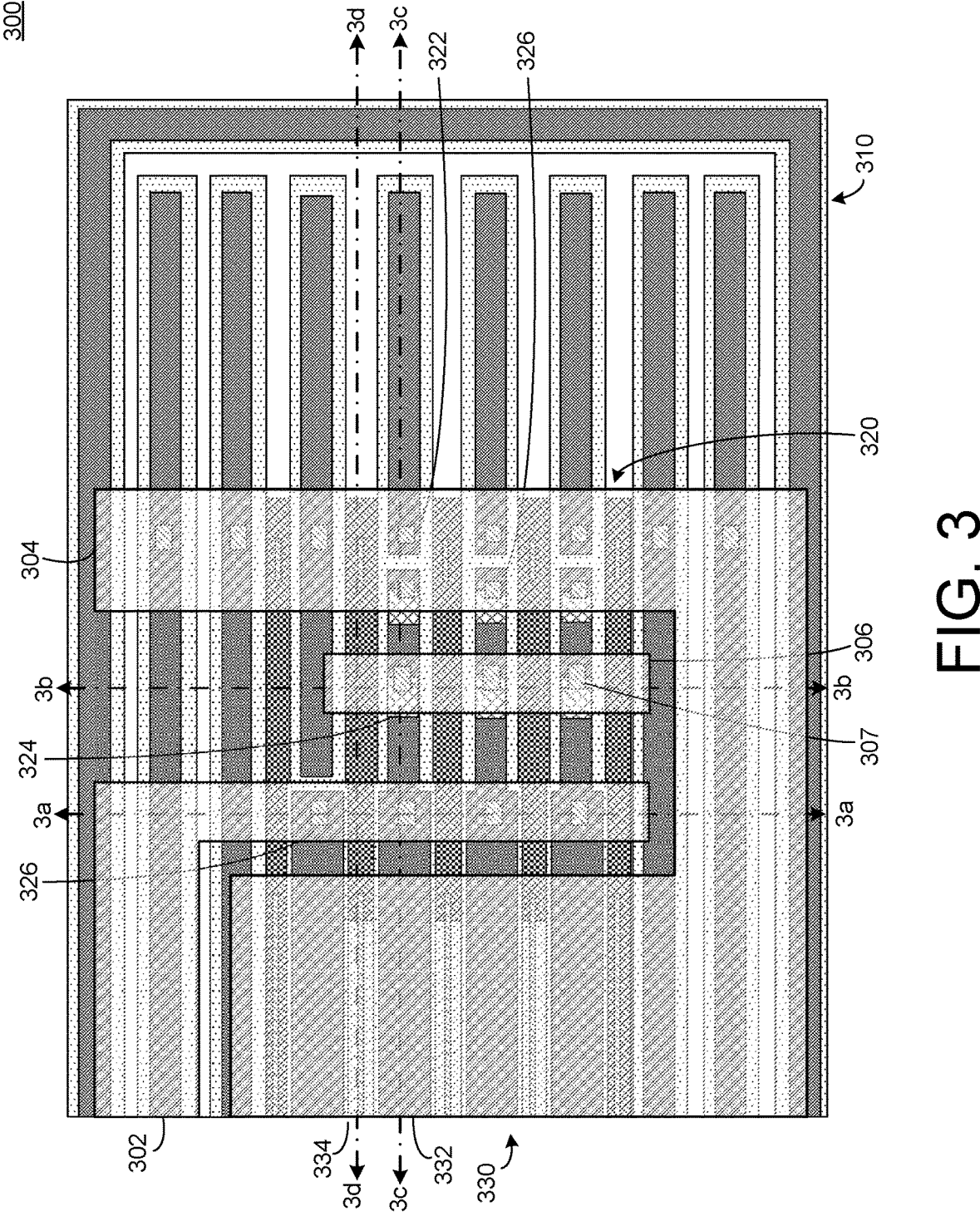
FIG. 3 is a diagram illustrating a top view of a semiconductor device that can be arranged in accordance with FIG. 1A.

Referring to FIG. 3, the device 300 is similar in structure to the device 200 of FIG. 2. As compared to the device 200, the device 300 differs in that it includes diode shorting metallization 306, which is used to short anodes and cathodes to produce single-sided diodes from a string of back-to-back diodes. As described herein, one application of such diode elements is sensing device temperature (e.g., temperature of the device 300). The device 300 also differs from the device 200 in that its source metallization is modified to accommodate the diode shorting metallization 306, and contacts from the modified source metallization to trench-implemented diodes also short anodes and cathodes to form single-sided diodes. In this example, the structure of the device 300 is otherwise the same as that of the device 200. Accordingly, specific details of the device 300 that are similar (or identical) to those of the device 200 are not necessarily described again in detail with respect to FIG. 3, or its corresponding cross-sectional views in FIGS. 3A-3D.

For purposes of comparison and context, the like and similar elements of the device 300 to the device 200 are referenced with 300 series reference numbers that correspond with the 200 series reference numbers for the corresponding elements. For instance, the device 300 includes a termination region 310, a trench-implemented device (trench device) region 320, an active area 330, gate metallization 302, source metallization 304, shield poly 312, shield dielectric 313, shield poly contacts 322, diode strings 324, anodes 324a, cathodes 324b, contacts 326 from source metallization 304 to the diodes, contacts 327 and 337 from the source metallization 304 to body regions 328, trenches 332, poly electrodes 333, mesas 334, contacts 336 from the gate metallization 302 to a gate electrode portion of a poly electrode 333, and dielectric material 346, as well as other elements not specifically referenced.

Figure 3A:
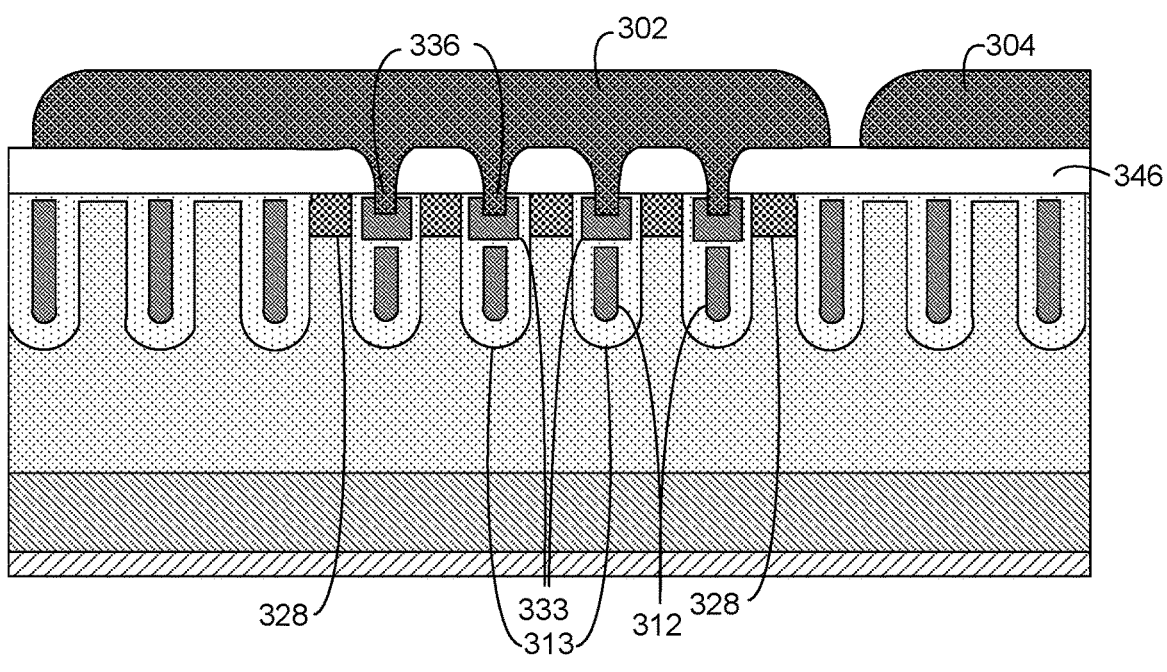
FIGS. 3A-3D are diagrams illustrating cross-sectional views of the semiconductor device of FIG. 3.
Figures 4A, 4B:
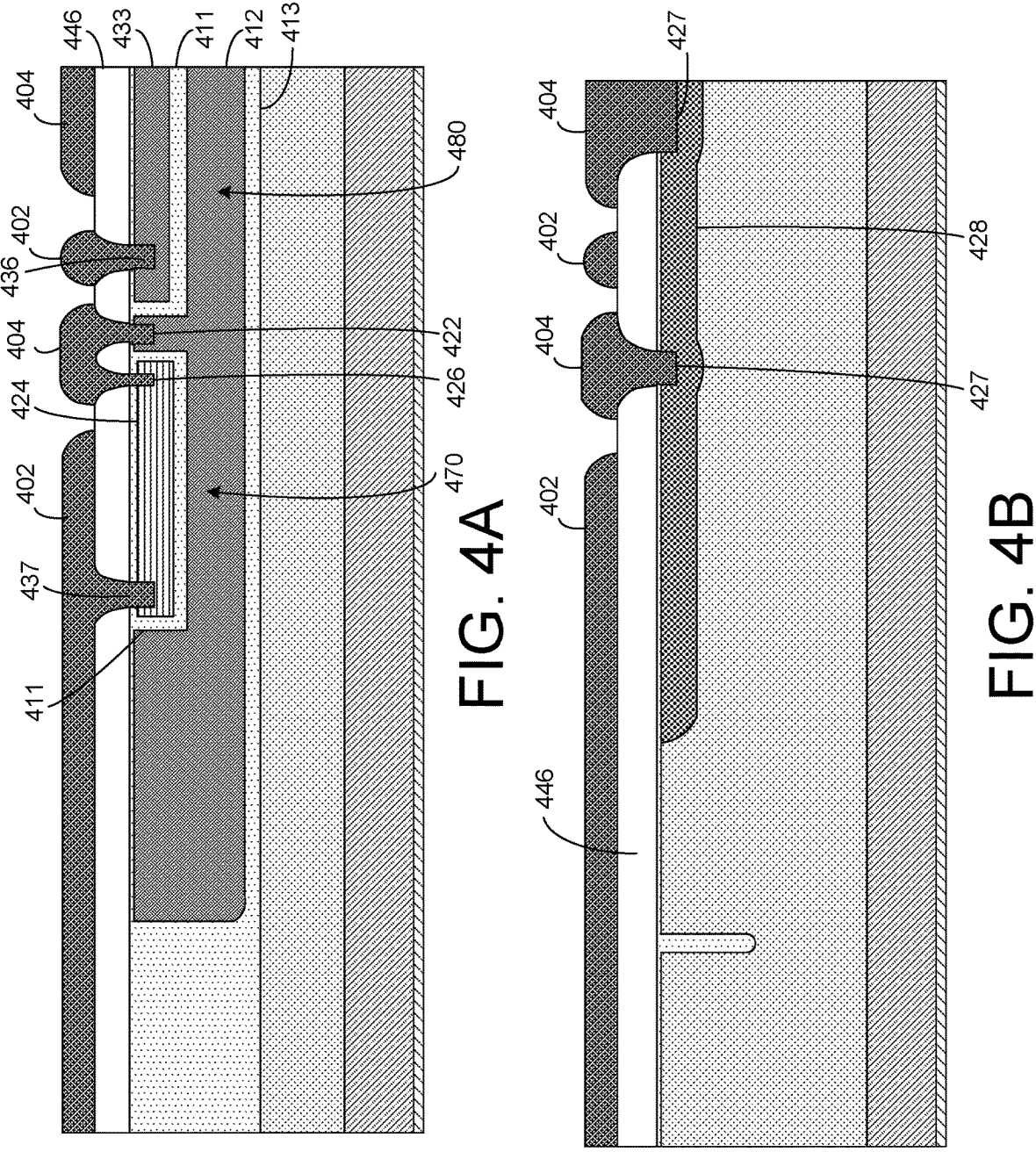
FIGS. 4A and 4B are diagrams illustrating cross-sectional views of the semiconductor device of FIG. 4.

FIG. 3A illustrates a cross-sectional view of the device 300 along the section line 3a-3a in FIG. 3. As can be seen from a comparison of FIG. 3A with FIG. 2A, in this example, the cross-sectional view of the device 300 along the section line 3a-3a is the same as the cross-sectional view of the device 200 along the section line 2a-2a. Accordingly, for purposes of brevity, FIG. 3A is not discussed further here.

Figure 3B:
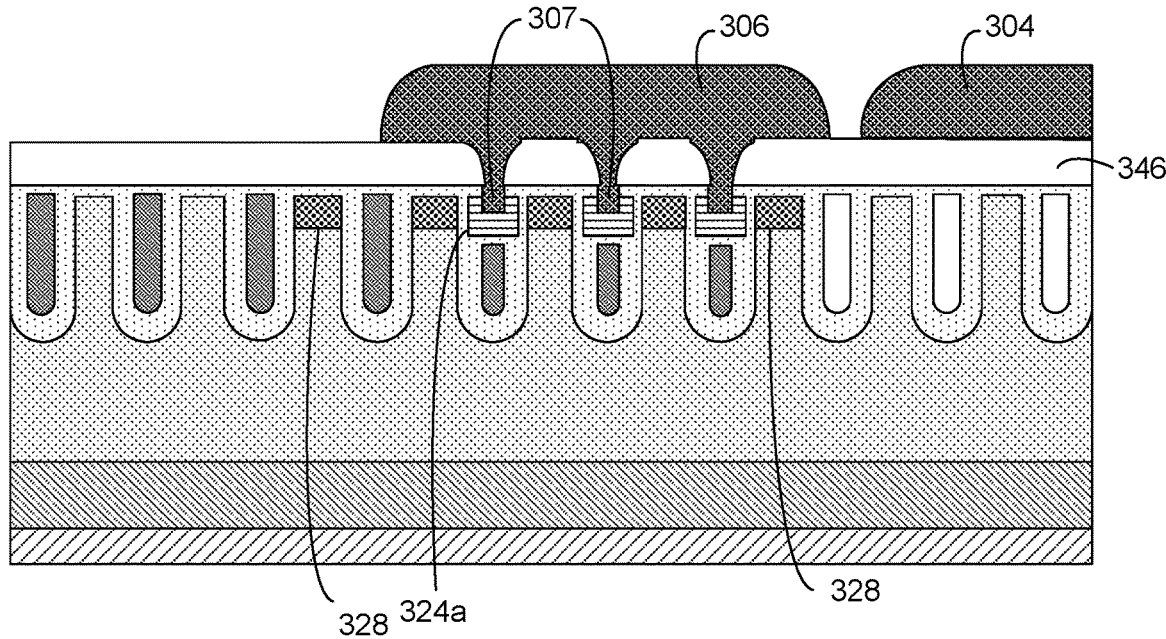

FIG. 3B illustrates a cross-sectional view of the device 300 along the section line 3b-3b in FIG. 3. As can be seen from FIGS. 3 and 3B, the section line 3b extends through the termination region 310 (along the top of the view in FIG. 3), through the diode shorting metallization 306 in the trench device region 320, and the source metallization 304 in the termination region 310 (along the bottom of the view in FIG. 3). The section line 3b-3b also extends through contacts 307 from the diode shorting metallization 306 to the diode strings 324. While the cross-sectional view of FIG. 3B is through an anode 324a, as can be seen in FIG. 3 (as well in FIG. 3C), the contacts 307 each short an anode 324a and an adjacent cathode 324b, which results in back-to-diodes being configured to operate as single-sided diodes.

Figures 3C, 3D:
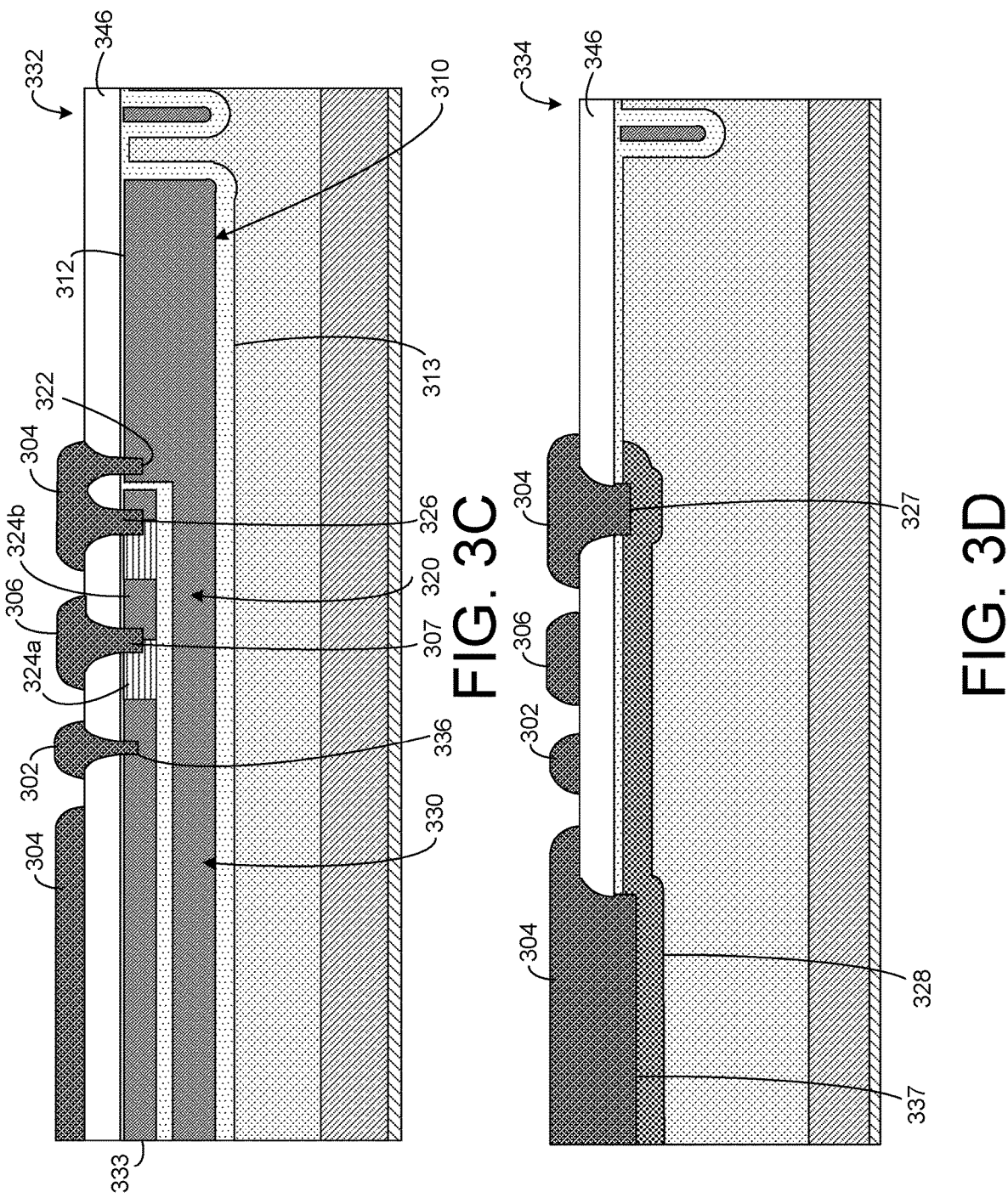

FIG. 3C illustrates a cross-sectional view of the device 300 along the section line 3c-3c in FIG. 3. As can be seen from FIGS. 3 and 3C, the section line 3c-3c extends through one of the trenches 332 from the termination region 310, through the trench device region 320 and into the active area 330. Referring again to FIG. 2F, the cross-sectional view shown in FIG. 3C (along the trench 332 of the device 300) is similar to that of the cross-sectional view of the device 200 shown in FIG. 2F (along the trench 232).

As shown by a comparison of FIG. 3C with FIG. 2F, the device 300 does differ from the device 200 in a number of respects. First, the diode string 324 includes two anodes 324a, rather than the four anodes 224a of the back-to-back diode string 224 of the device 200. Second, the contacts 307 (of the diode shorting metallization 306) and the contacts 326 (of the source metallization 304) short a respective one of the anodes 324a with a respective one of the cathodes 324b in the diode string 324 to form two single-sided diodes, rather than a back-to-back diode configuration as implemented in the device 200.

As also shown in FIGS. 3 and 3D, a gate electrode portion of the poly electrode 333 (e.g., a first portion of the poly electrode 333) is coupled with the gate metallization 302 via the contact 336 in the active area 330, while a second portion of the poly electrode 333 includes the single-sided diodes 324 in the trench device region 320. In other implementations different poly electrodes can be used to respectively implement the different portions of the poly electrode 333. That is, a first poly electrode can be used for the first (gate electrode) portion, and a second poly electrode can be used for the second portion including the single-sided diodes 324 (or other trench-implemented devices). The different poly electrodes can be formed from a same semiconductor material, or from different semiconductor materials.

FIG. 3D illustrates a cross-sectional view of the device 300 along the section line 3d-3d in FIG. 3. As can be seen from FIGS. 3 and 3D, the section line 3d-3d extends through one of the mesas 334 from the termination region 310, through the trench device region 320 and into the active area 330. Referring again to FIG. 2G, the cross-sectional view shown in FIG. 3D (along the mesa 334 of the device 300) is similar to that of the cross-sectional view of the device 200 shown in FIG. 2G (along the mesa 234). As shown by a comparison of FIG. 3D with FIG. 2G, the device 300 does differs from the device 200 in that a portion of the diode shorting metallization is also disposed on the dielectric material 346, e.g., in addition to the portion of the gate metallization 302 disposed on the dielectric material 346.

Referring to FIG. 4, and its corresponding cross-sectional views in FIGS. 4A-4B, the device 400 can include a termination region 460 that is disposed around a perimeter of the device 400. The device 400 can also include a trench device region 470 and an active area 480 (e.g., as in the arrangement of the device 150 in FIG. 1B). In this example, a polysilicon resistor 424, which can be doped n-type or p-type, is implemented in the trench device region 470 and a shielded trench-gate MOSFET is implemented in the active area 480, where the polysilicon resistor 424 is electrically coupled between a gate terminal and a source terminal (ground) of the MOSFET implemented in the active area 480.

As shown in FIG. 4, the device 400 includes gate metallization 402 including a gate pad 403 that can be used to provide a gate signal to the MOSFET, and source metallization 404 that can be used to provide a source potential to the MOSFET, as well as to other elements of the device 400. As further shown in FIG. 4, the device 400 includes trenches 432 and semiconductor mesas 434 that extend from the trench device region 470 into the active area 480.

In this example, the device 400 also includes similar elements as the devices 200 and 300 described above. For instance, as shown in FIGS. 4, 4A and 4B, the device 400 includes shield poly 412, interlayer dielectric 411, shield dielectric 413, shield poly contacts 422, contacts 426 from source metallization 404 to the polysilicon resistor 424, contacts 427 from the source metallization 404 to body regions 428, poly electrodes 433, contacts 436 from the gate metallization 402 to a gate electrode portion of a poly electrode 433, and dielectric material 446, as well as other elements not specifically referenced.

Figure 5:
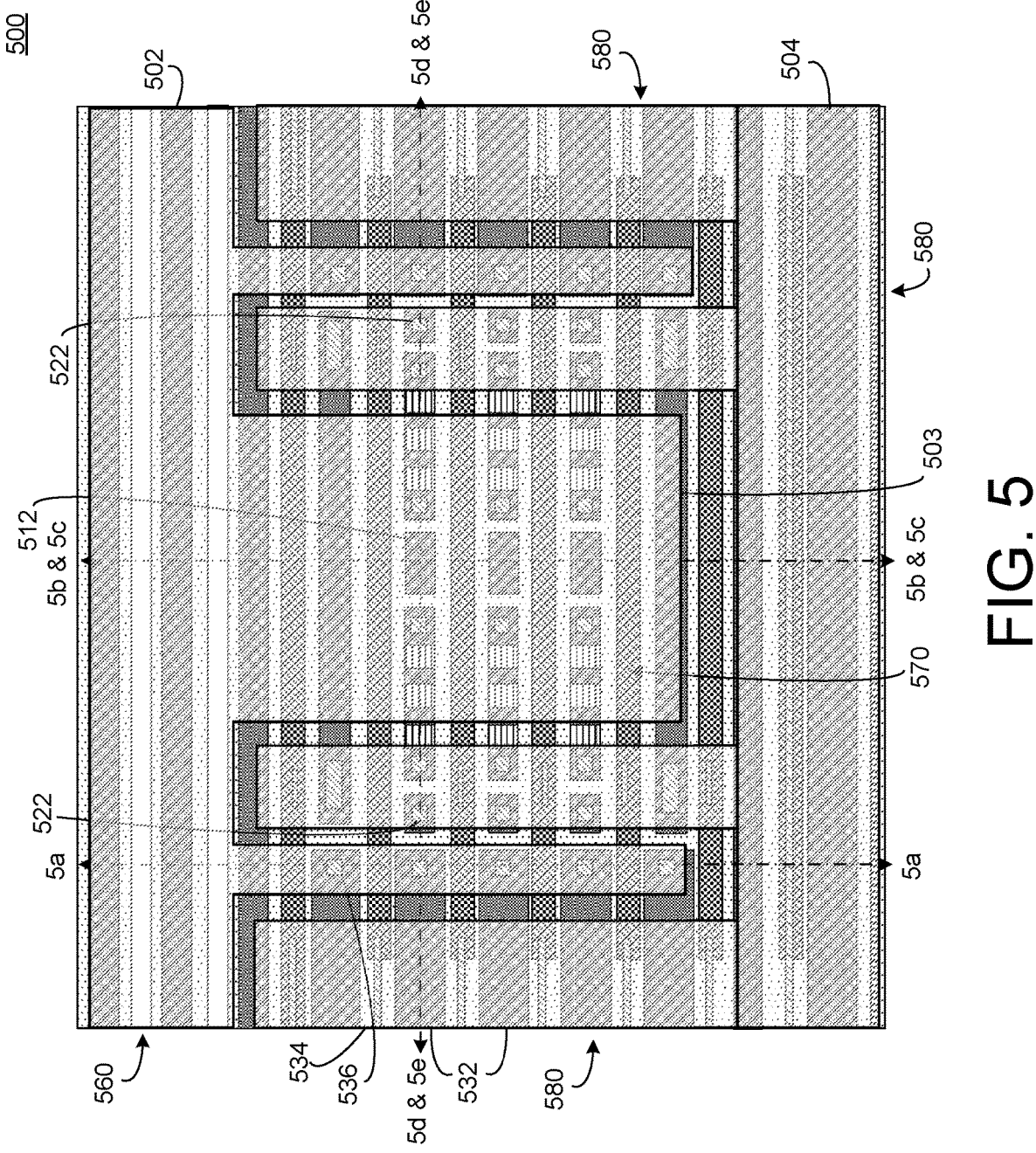
FIG. 5 is a diagram illustrating a top view of an example semiconductor device that can be arranged in accordance with FIG. 1B.

As shown in FIG. 4, the trenches 332 can be discontinuous under the gate pad 403, or, in some implementations, can be continuous under a gate pad, such as in the device 500 of FIG. 5. In the device 400, a portion of the trench device region 570 is disposed under a first portion of the gate pad 403, with an arrangement of oxide filled trenches being disposed under a second portion of the gate pad 403. In some implementations, trenches can be excluded from under a gate pad. The particular arrangement of features, or exclusion of features, under a gate pad will depend on the particular implementation.

FIG. 4A illustrates a cross-sectional view of the device 400 along the section line 4a-4a in FIG. 4. As can be seen from FIGS. 4 and 4A, the section line 4a-4a extends through one of the trenches 432. As shown in FIG. 4A, in the trench 432, the shield poly 412 extends under the poly resistor 424 and the poly electrode 433. In this example, the polysilicon of the poly resistor 424 and the poly electrode 433 can be deposited, or formed using a same processing operation. As shown in FIG. 4A, the shield poly 412 is disposed between the poly resistor and the drain metal contact, and between the poly (e.g., gate electrode 233) and the drain metal contact, e.g., to implement a grounded field plate to shield the poly resistor 424 and the poly electrode 433 from the drain potential during operation of the MOSFET.

As can be seen in FIG. 4A, a first end of the poly resistor 424 can be electrically coupled with the gate metallization 402 via a contact 437, and a second end of the poly resistor 424 can be electrically coupled with the source metallization via a contact 426, while the source metallization can also be coupled to the shield poly 412 via a contact 422 that is proximate the poly resistor 424. As also shown in the sectional view of FIG. 4A, the gate metallization can be electrically coupled with the poly (gate) electrode 433 via a contact 436.

As also shown in FIGS. 4 and 4D, separate (e.g., different) semiconductor material portions are used to respectively implement a gate electrode and the poly resistor 424. For instance, the poly electrode 433 is coupled with the gate metallization 402 via the contact 436 in the active area 480. Also, a separate poly electrode includes the poly resistor 424 in the trench device region 470. In some implementations, these poly electrodes can be formed as different portions of a same semiconductor material. In other implementations different semiconductor materials can be used for the gate electrode and the poly resistor 424, respectively.

FIG. 4B illustrates a cross-sectional view of the device 400 along the section line 4b-4b in FIG. 4. As can be seen from FIGS. 4 and 4B, the section line 4b-4b extends through one of the mesas 434 of the device 400. As shown in FIGS. 4 and 4B, the source metallization 404 is electrically coupled with the well region 428 via contacts 427. In this cross-sectional view, the gate metallization 402 over the mesa 434 is disposed on a dielectric material 446 without contact to any underlying elements.

Referring to FIG. 5, and its corresponding cross-sectional views in FIGS. 5A-5E, the device 500 can include a termination region 560 that is disposed around a perimeter of the device 500. The device 500 can also include a trench device region 570 and an active area 580 (e.g., as in the arrangement of the device 150 in FIG. 1B). In this example, a plurality of strings of back-to-back diodes 524 are implemented in the trench device region 570 and a shielded trench-gate MOSFET is implemented in the active area 580, where the back-to-back diodes are electrically coupled between a gate terminal and a source terminal (ground) of the MOSFET implemented in the active area 580.

As shown in FIG. 5, the device 500 includes gate metallization 502 including a gate pad 503 that can be used to provide a gate signal to the MOSFET, and source metallization 504 that can provide electrical connecting to the MOSFET's active area, as well as to other elements of the device 500. As further shown in FIG. 5, the device 500 includes trenches 532 and semiconductor mesas 534 that extend through both the trench device region 570 and the portions of the active area 580 that are disposed on either side of the trench device region 570.

In this example, the device 500 also includes similar elements as the devices 200, 300 and 400 described above. For instance, as shown in FIGS. 5 and 5A-5E, the device 500 includes shield poly 512, interlayer dielectric 511, shield dielectric 513, shield poly contacts 522, contacts 526 from source metallization 504 to the strings of back-to-back diodes 524, contacts 527 from the source metallization 504 to body regions 528, poly electrodes 533, contacts 536 from the gate metallization 502 to a gate electrode portion of a poly electrode 533, and dielectric material 546, as well as other elements not specifically referenced.

Figure 5A:
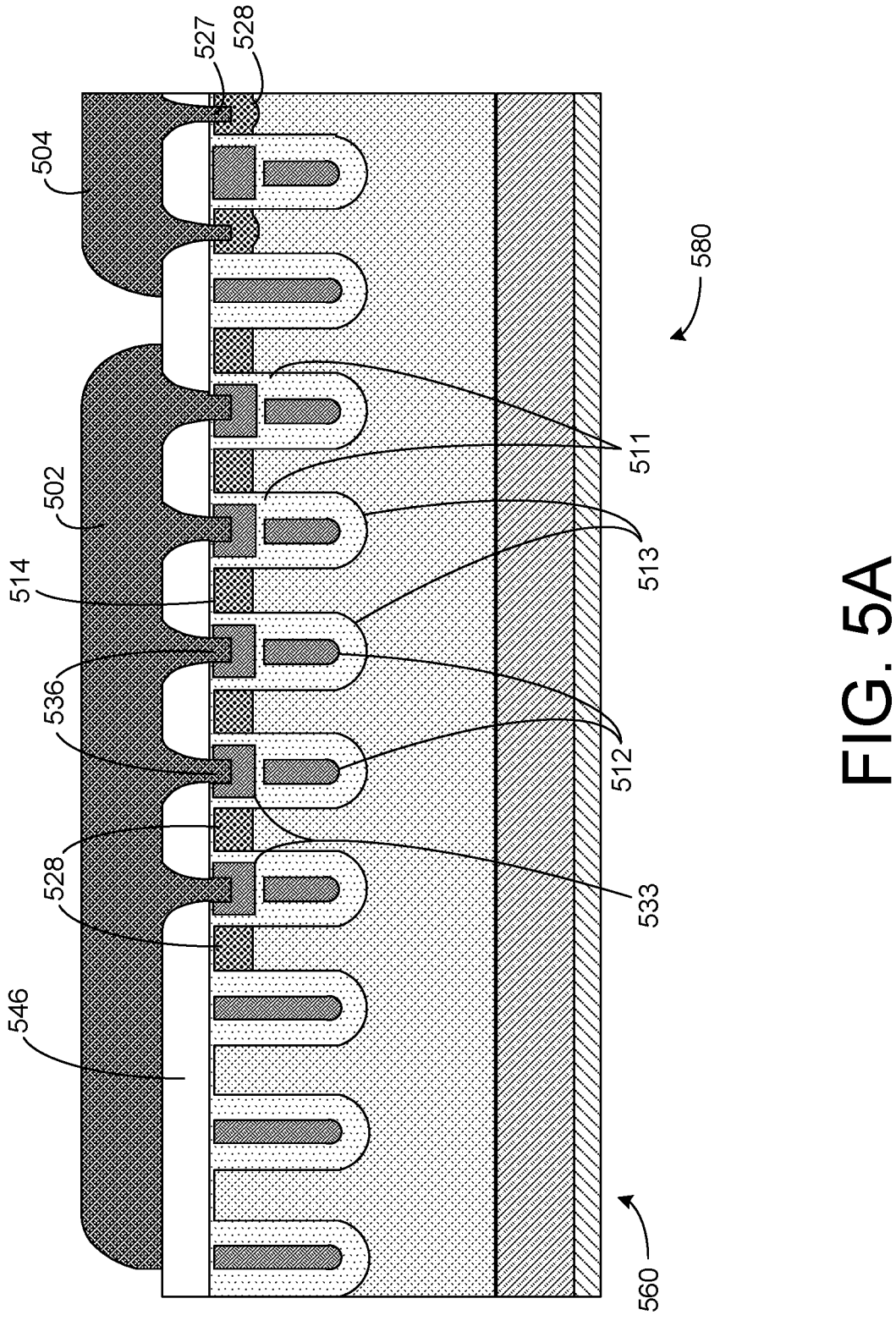
FIGS. 5A-5E are diagrams illustrating cross-sectional views of the semiconductor device of FIG. 5.

FIG. 5A illustrates a cross-sectional view of the device 500 along the section line 5a-5a in FIG. 5. As can be seen from FIGS. 5 and 5A, the section line 5a-5a extends through the gate metallization 502 in the termination region 560 (along the top of the device 500 in the view of FIG. 5) and the active area 580, and through the source metallization 504 in the active area 580 (along the bottom of the device 500 in FIG. 5). As shown in the cross-sectional view of FIG. 5A and the layout view of FIG. 5, the gate metallization 502 is electrically coupled with polysilicon electrodes (poly electrodes) 533 disposed in upper portions of the trenches via contacts 536. As also shown in FIGS. 5 and 5A, the source metallization is electrically coupled with body regions included in mesas in the active area 580 via contacts 527.

In the active area 580, the poly electrodes 533 implement gate electrodes of the MOSFET. As further shown in FIG. 5A, in the active area 580, shield polysilicon (shield poly) 512 is recessed in the trenches 532 and interlayer dielectric 511 is disposed between the shield poly 512 and the poly electrodes 533. Also in the trenches 532, as shown in FIG. 5A, in the active area 580, a shield dielectric 513 is included in a lower portion of the trenches, while a (thinner) gate dielectric 514 is included in an upper portion of the trenches 532.

In the termination region 560, as shown in FIG. 5A, un-recessed shield poly 512 is disposed in termination trenches lined with shield dielectric 513. Depending on the implementation, this un-recessed shield poly can be electrically coupled to source metallization 504, or can be floating. In example implementations, termination trenches can alternately include recessed shield poly and oxide filled trenches. FIGS. 5 and 5A (as well FIGS. 5B-5C) also illustrate well regions 528 (e.g., p-type well regions for an n-channel MOSFET), which are disposed adjacent to the trenches 532 (e.g., at a surface of a semiconductor substrate of the device 500). The well regions 528 can include a body region of the MOSFET, and also can provide sidewall shielding to trench-implemented devices in the trench device region 570. The depth of the well-regions 528 (not touching well in FIG. 5A), as discussed herein, can depend on the particular implementation, such as on an operating voltage of a MOSFET implemented in the active area 580.

Figures 5B, 5C:
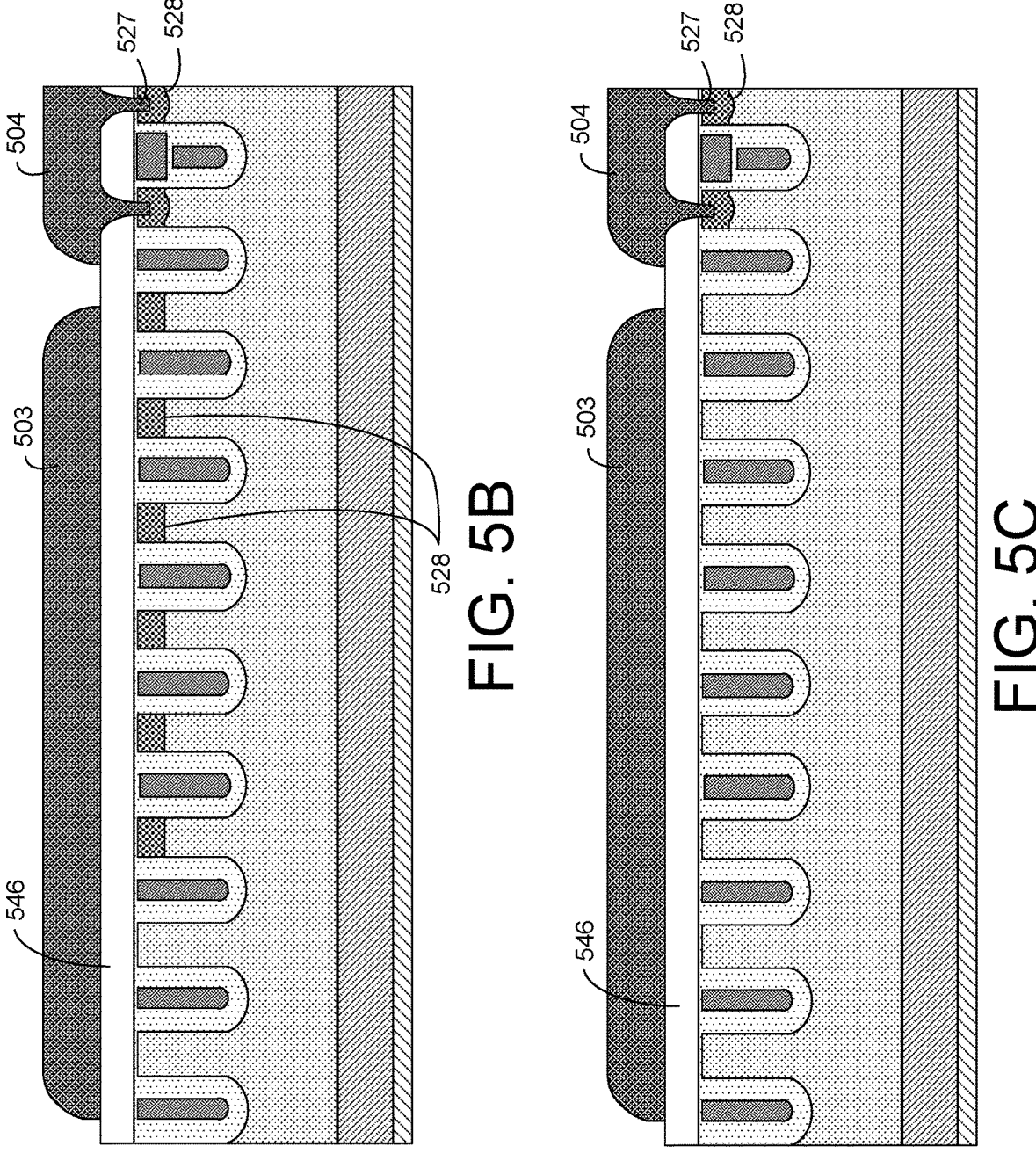

FIGS. 5B and 5C illustrate two example cross-sectional views of the device 500 along the section line indicated as 5b & 5c-5b & 5c in FIG. 5. As can be seen from FIGS. 5, 5B and 5C, the section line 5b & 5c-5b & 5c extends through the gate metallization 502 in the termination region 560, through a center of the gate pad 503 in the trench device region 570 and through the source metallization 504 in the active area 580 (at the bottom of the device 500 in the view of FIG. 5). FIG. 5B illustrates an implementation where the well regions 528 are continuous under the gate pad 503. In comparison with FIG. 5B, FIG. 5C illustrates an implementation where the well regions 528 are discontinuous under the gate pad 503.

Figures 5D, 5E:
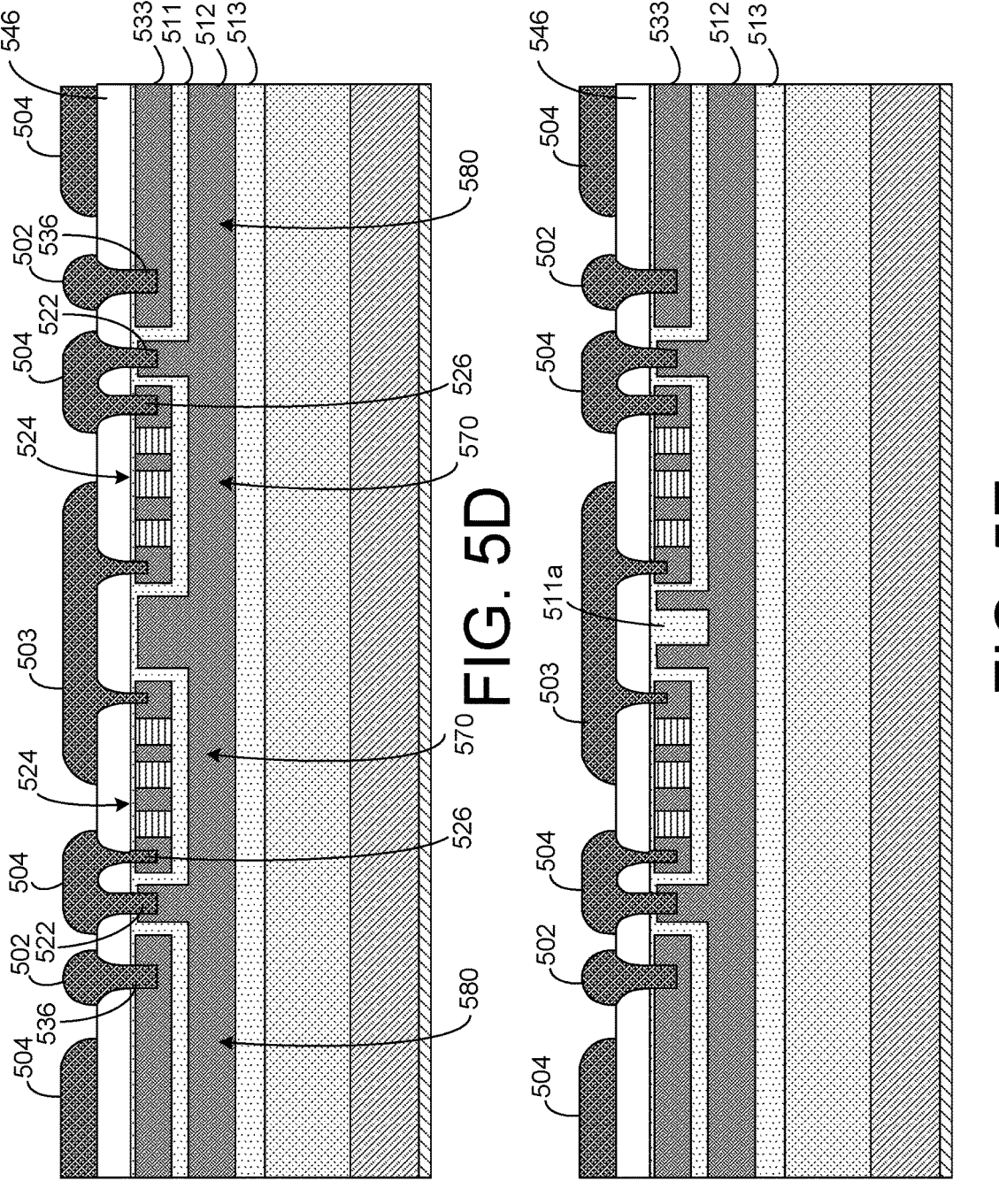

FIGS. 5D and 5E illustrate two example cross-sectional views of the device 500 along the section line indicated as 5d & 5e-5d & 5e in FIG. 5. As can be seen from FIGS. 5, 5D and 5E, the section line 5d & 5e-5d & 5e extends through one of the trenches 532, e.g., from the active area 580 on the left side of the device 500 in FIG. 5, through the trench device region 570, and into the active area 580 on the right side of the device 500. As shown in FIGS. 5D and 5E, in the trench 532, the shield poly 512 extends under the poly electrode 533, where the poly electrode 533 implements both a gate electrode of the MOSFET of the device 500 and the strings of back-to-back diodes 524, such as by implanting portions of the poly electrode 533. The shield poly 512 is thus disposed between the poly electrode 533 and the drain metal contact, e.g., to implement a grounded field plate to shield the strings of back-to-back diodes 524 from the drain potential during operation of the MOSFET, as well as gate electrodes of the MOSFET.

As also shown in FIGS. 5, 5D and 5E, separate (e.g., different) semiconductor material portions are used to respectively implement gate electrodes and the back-to-back diodes 524. For instance, the poly electrode 533 is coupled with the gate metallization 502 via the contact 536 in the active area(s) 580. Also, separate poly electrodes includes the back-to-back diodes 524 in the trench device region(s) 570. In some implementations, these poly electrodes can be formed as different portions of a same semiconductor material. In other implementations different semiconductor materials can be used for the gate electrodes and the back-to-back diodes 524, respectively.

In this implementation, the strings of back-to-back diodes 524 are mirrored on each side of the gate pad 503, with the shield poly 512 coming up between the strings of back-to-back diodes 524 in FIG. 5D. In comparison with FIG. 5D, in FIG. 5E a portion 511a of the interlayer dielectric layer is also disposed, with the shield poly 512, between the strings of back-to-back diodes 524. In some implementations, e.g., based on a width of the gate pad, the shield poly 512 between the strings of back-to-back diodes 524 can be widened, increasing a distance and isolation between the strings of back-to-back diodes 524. The approaches of FIGS. 5D and 5E can be used to reduce electric fields under the gate pad 503 due to drain potential, as well to reduce gate to source capacitance under the gate pad 503.

Further in FIGS. 5D and 5E, as in FIG. 2F, adjacent diodes of the string of back-to-back diodes 524 share either a cathode or an anode. The strings of back-to-back diodes 524 are each electrically coupled, at one end of the string, to the gate pad 503 via the contacts 536, and coupled to the source metallization 504 at the other end of the string via the contact 526. Similarly, as in FIG. 2F, as shown in FIGS. 5, 5D and 5E, the shield poly 512 is electrically coupled to the source metallization via contacts 522, which are each proximate to (e.g., within 10 micrometers of) a respective string of back-to-back diodes 524 (e.g., adjacent to vertical portions of the interlayer dielectric 511). As also shown in FIGS. 5, 5D and 5E, the gate electrode portions of the poly electrode 533 are coupled with the gate metallization 502 via respective contacts 536.

Figure 6:
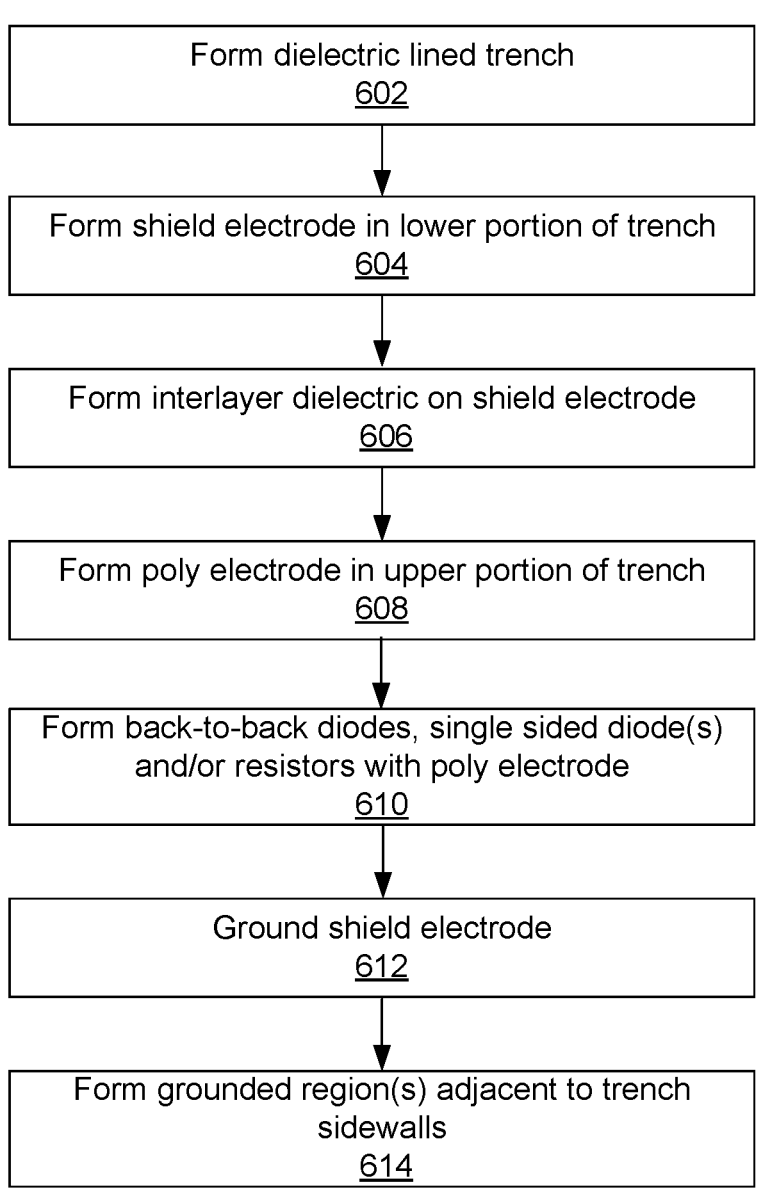
FIG. 6 is a flowchart illustrating a method 600 for producing a diode and/or a resistor in a shielded trench.

FIG. 6 is a flowchart illustrating a method 600 for producing a diode and/or a resistor in a shielded trench. In implementations, the method 600 can be used to produce a semiconductor device including a MOSFET, such as those devices described herein. The method 600, at block 602, includes forming a dielectric lined trench in a semiconductor substrate. In some implementations, the trench of block 602 can be formed in conjunction with formation of gate trenches of a corresponding shielded trench-gate MOSFET, such as in the implementations of FIGS. 2, 3, 4 and 5. The dielectric lining at block 602 can be a shield dielectric lining (e.g., can be thicker than a corresponding gate dielectric used in a MOSFET device). At block 604, a shield electrode can be formed in lower portion of the trench of block 602, where the dielectric lining is disposed between the shield electrode and the semiconductor substrate. In implementations, the shield electrode of block 604 can be formed in conjunction with formation of gate shield electrodes included in gate trenches of a corresponding MOSFET.

At block 606, the method 600 includes forming an interlayer dielectric (e.g., an inter-polysilicon dielectric) on the shield electrode of block 604, where the interlayer dielectric can be formed in conjunction with formation of interlayer dielectrics in MOSFET gate trenches. At block 608, a polysilicon electrode is formed in an upper portion of the trench, where the shield dielectric layer is disposed between the polysilicon electrode and the semiconductor substrate, and the interlayer dielectric layer is disposed between the shield electrode and the polysilicon electrode. In implementations, the polysilicon electrode of block 608 can be formed in conjunction with formation of gate electrodes in MOSFET gate trenches.

At block 610, the method includes doping the polysilicon electrode to define at least one of back-to-back diodes, one or more single-sided diodes, or one or more resistors in the polysilicon electrode of block 608. The doping of the polysilicon electrode can be performed in conjunction with doping other portions of a semiconductor device, such as doping of source regions, body regions, and/or heavy body regions, as some examples.

At block 612, the method includes electrically coupling the shield electrode of block 604 with electrical ground (e.g., with a source terminal and/or a body region of an n-channel MOSFET). In some implementations, the shield electrode can be tied to other potentials or left floating. In the example of FIG. 6, the shield electrode can be coupled to electrical ground using a contact (metal contact) that is proximate the trench-implemented devices. At block 614, the method 600 includes one or more grounded regions adjacent to a sidewall of the trench. The one or more grounded regions can include well regions (e.g., that are common with a body region of a corresponding MOSFET). In some implementations, the regions adjacent to the sidewall of the trench can be coupled to other potentials (e.g., to a source potential of a corresponding p-channel MOSFET), or left floating.

The various implementations described herein are given by way of example and for purposes of illustration. In such implementations, as well as other implementations, variations on the particular materials, doping approaches, and/or relationships between the different device elements are possible. For instance, semiconductor material used to form trench-implemented devices can be undoped polysilicon (e.g., that can be doped after formation, or left undoped). Doping for trench-implemented devices (e.g., diodes and/or resistors) can be performed using a same doping operation used to dope gate electrodes (or other elements) of a corresponding transistor (e.g., MOSFET) device, or can be performed using different doping than that used for doping elements of a corresponding transistor device.

In some implementations, gate electrodes can be formed using heavily, in-situ doped polysilicon, while trench-implemented devices can be formed using a separately deposited polysilicon material (re-deposited polysilicon), that includes doped and/or undoped portions. In some implementations, shield poly can be formed and recessed (e.g., etched) in a trench, and the trench can then be dielectric filled on top of the recessed shield poly. The dielectric fill can then be etched to desired thickness and/or patterned and etched for use as gate dielectric. One more poly silicon layers (e.g. a second semiconductor material, a third semiconductor material, etc.) can then be deposited, planarized and doped to form gate electrodes and/or trench-implemented devices.

In implementations including single sided diodes for temperature sensing, the diodes (e.g., each end of a diode string) can be connected to pad metal for external connection to a control circuit. In such implementations, contacts to a body region, MOSFET source region, and/or a MOSFET gate can be omitted. However, associated body regions can be connected to shield poly and/or source metallization to provide shielding from an applied potential (e.g., a MOSFET drain potential). In implementation, trench-implemented devices can be connected in series and/or in parallel with a corresponding transistor (e.g., MOSFET) device, and can be internally connected in a semiconductor die, and/or can have one or more connections that are external to the semiconductor die.

It will understood, for purposes of this disclosure, that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device comprising:
a semiconductor substrate;
a trench formed in the semiconductor substrate;
a first dielectric layer lining the trench;

a first semiconductor material disposed in a lower portion of the trench, the first dielectric layer being disposed between the semiconductor substrate and the first semiconductor material;
a second dielectric layer disposed on the first semiconductor material; and
a second semiconductor material disposed in an upper portion of the trench and excluded from the lower portion of the trench, the second semiconductor material including a plurality of diodes and a gate electrode, the second dielectric layer being disposed between the first semiconductor material and the second semiconductor material.

2. The semiconductor device of claim 1, further comprising a metal-oxide-semiconductor field-effect transistor (MOSFET) disposed in the semiconductor substrate, wherein:
the first semiconductor material is electrically coupled with a body region and a source terminal of the MOSFET; and
the first semiconductor material is disposed between a drain region of the MOSFET and the second semiconductor material.

3. The semiconductor device of claim 2, wherein the MOSFET is an n-channel MOSFET, the semiconductor device further comprising a p-type well region disposed in the semiconductor substrate adjacent to the trench, the p-type well region being electrically coupled with the body region and the source terminal of the MOSFET and the first semiconductor material.

4. The semiconductor device of claim 3, wherein the p-type well region and the body region of the MOSFET are a same well region.

5. The semiconductor device of claim 3, wherein the p-type well region is electrically coupled with the body region and the source terminal of the MOSFET via a metal contact that is proximate to the trench.

6. The semiconductor device of claim 2, wherein the plurality of diodes is electrically coupled between a gate terminal of the MOSFET and the source terminal of the MOSFET.

7. The semiconductor device of claim 2, wherein the first semiconductor material is electrically coupled with the body region and the source terminal of the MOSFET via a metal contact that is proximate to the plurality of diodes.

8. The semiconductor device of claim 1, wherein:
the first semiconductor material is first polysilicon material; and
the second semiconductor material is second polysilicon material.

9. The semiconductor device of claim 1, wherein the plurality of diodes includes a first diode and a second diode, the first diode and the second diode having a shared anode.

10. The semiconductor device of claim 1, wherein the plurality of diodes includes a first diode and a second diode, an anode of the first diode being electrically coupled with a cathode of the second diode.

11. The semiconductor device of claim 1, wherein the first dielectric layer is a shield dielectric layer.

12. The semiconductor device of claim 1, wherein each of the plurality of diodes is disposed at a same depth in the trench.

13. The semiconductor device of claim 1, wherein the second semiconductor material is a polysilicon electrode, and wherein a first portion of the polysilicon electrode includes the plurality of diodes and wherein a second portion of the polysilicon electrode includes the gate electrode.

14. The semiconductor device of claim 1, wherein the lower portion of the trench is free of diodes.

15. A semiconductor device comprising:

a semiconductor substrate;

a first trench formed in the semiconductor substrate;

a second trench formed in the semiconductor substrate;

a first dielectric layer lining the first trench and the second trench;

a first semiconductor material disposed in a lower portion of the first trench and a lower portion of the second trench, the first dielectric layer being disposed between the semiconductor substrate and the first semiconductor material in the first trench and in the second trench;

a second dielectric layer disposed on the first semiconductor material in the first trench and in the second trench;

a second semiconductor material disposed in an upper portion of the first trench and in an upper portion of the second trench, the first dielectric layer being disposed between the semiconductor substrate and the second semiconductor material in the first trench and in the second trench, the second dielectric layer being disposed between the first semiconductor material and the second semiconductor material in the first trench and in the second trench, the second semiconductor material being excluded from the lower portion of the first trench and the lower portion of the second trench; and for each of the first trench and the second trench, the second semiconductor material includes a plurality of diodes and a gate electrode.

16. The semiconductor device of claim 15, further comprising a metal-oxide-semiconductor field-effect transistor (MOSFET) disposed in the semiconductor substrate, wherein, for each of the first trench and the second trench:

the first semiconductor material is electrically coupled with a body region and a source terminal of the MOSFET; and the first semiconductor material is disposed between a drain region of the MOSFET and the second semiconductor material.

17. The semiconductor device of claim 16, wherein the MOSFET is an n-channel MOSFET, the semiconductor device further comprising a p-type well region disposed in the semiconductor substrate adjacent to the first trench and adjacent to the second trench, the p-type well region being electrically coupled with the body region and the source terminal of the MOSFET and the first semiconductor material.

* * * * *